United States Patent [19]

Sato et al.

[11] Patent Number: 5,289,428
[45] Date of Patent: Feb. 22, 1994

[54] SEMICONDUCTOR MEMORY DEVICE

[75] Inventors: Katsuyuki Sato, Akishima; Miki Matsumoto; Sadayuki Ohkuma, both of Ohme; Masahiro Ogata, Fussa; Masahiro Yoshida, Tachikawa, all of Japan

[73] Assignee: Hitachi Ltd., and Hitachi VLSI Engineering Corp., Tokyo, Japan

[21] Appl. No.: 972,913

[22] Filed: Nov. 6, 1992

Related U.S. Application Data

[60] Division of Ser. No. 754,019, Sep. 3, 1991, which is a continuation of Ser. No. 496,258, Mar. 20, 1990, Pat. No. 5,115,413.

[30] Foreign Application Priority Data

Mar. 20, 1989 [JP] Japan .................................. 1-65843

[51] Int. Cl.$^5$ ............................................. G11C 13/00
[52] U.S. Cl. ......................... 365/230.05; 365/230.09; 365/230.03
[58] Field of Search .................. 365/189.01, 230.05, 365/230.09, 189.03, 230.03

[56] References Cited

U.S. PATENT DOCUMENTS

| | | |
|---|---|---|
| 3,402,398 | 9/1968 | Koerner .................. 365/189.01 |
| 4,044,341 | 8/1977 | Stewart .................. 365/189.01 |
| 4,658,377 | 4/1987 | McElroy .................. 365/189.01 |

Primary Examiner—Terrell W. Fears
Attorney, Agent, or Firm—Antonelli, Terry Stout & Kraus

[57] ABSTRACT

A multiport memory is provided which permits both random access and serial access. In order to reduce parasitic capacitance and improve operating speed, the serial input/output lines are each divided into two parts at their middle points. Sense amplifiers for the serial input/output lines are provided at upper and lower ends of the serial access memory elements to respectively amplify signals from the divided lines. Additional features are provided for improving both the serial and random operation. For example, during the serial read mode, the column selector for random access is simultaneously operated, and read data passing through the random access column selector is used as head data for the serial output operation to be delivered through the serial output circuit. Also, a serial selector can be controlled by a select signal formed by a Gray Code counter to improve operating speed. Further features included a redundancy system for relief of defective bits, the use of common bit lines to improve integration density and an improved refreshing arrangement to reduce power consumption during the refresh mode.

18 Claims, 34 Drawing Sheets

FIG. 9

| ADDRESS | COUNTER ADDRESS ||||||||| GRAY CODE ADDRESS |||||||||
|---|---|---|---|---|---|---|---|---|---|---|---|---|---|---|---|---|---|---|
| | SY0 | SY1 | SY2 | SY3 | SY4 | SY5 | SY6 | SY7 | SY8 | SG0 | SG1 | SG2 | SG3 | SG4 | SG5 | SG6 | SG7 | SG8 |
| 0 | 0 | 0 | 0 | 0 | 0 | 0 | 0 | 0 | 0 | 0 | 0 | 0 | 0 | 0 | 0 | 0 | 0 | 0 |
| 1 | 1 | 0 | 0 | 0 | 0 | 0 | 0 | 0 | 0 | 1 | 0 | 0 | 0 | 0 | 0 | 0 | 0 | 0 |
| 2 | 0 | 1 | 0 | 0 | 0 | 0 | 0 | 0 | 0 | 1 | 1 | 0 | 0 | 0 | 0 | 0 | 0 | 0 |
| 3 | 1 | 1 | 0 | 0 | 0 | 0 | 0 | 0 | 0 | 0 | 1 | 0 | 0 | 0 | 0 | 0 | 0 | 0 |
| 4 | 0 | 0 | 1 | 0 | 0 | 0 | 0 | 0 | 0 | 0 | 1 | 1 | 0 | 0 | 0 | 0 | 0 | 0 |
| 5 | 1 | 0 | 1 | 0 | 0 | 0 | 0 | 0 | 0 | 1 | 1 | 1 | 0 | 0 | 0 | 0 | 0 | 0 |
| 6 | 0 | 1 | 1 | 0 | 0 | 0 | 0 | 0 | 0 | 1 | 0 | 1 | 0 | 0 | 0 | 0 | 0 | 0 |
| 7 | 1 | 1 | 1 | 0 | 0 | 0 | 0 | 0 | 0 | 0 | 0 | 1 | 0 | 0 | 0 | 0 | 0 | 0 |
| 8 | 0 | 0 | 0 | 1 | 0 | 0 | 0 | 0 | 0 | 0 | 0 | 1 | 1 | 0 | 0 | 0 | 0 | 0 |
| 9 | 1 | 0 | 0 | 1 | 0 | 0 | 0 | 0 | 0 | 1 | 0 | 1 | 1 | 0 | 0 | 0 | 0 | 0 |
| 10 | 0 | 1 | 0 | 1 | 0 | 0 | 0 | 0 | 0 | 1 | 1 | 1 | 1 | 0 | 0 | 0 | 0 | 0 |
| 11 | 1 | 1 | 0 | 1 | 0 | 0 | 0 | 0 | 0 | 0 | 1 | 1 | 1 | 0 | 0 | 0 | 0 | 0 |
| 12 | 0 | 0 | 1 | 1 | 0 | 0 | 0 | 0 | 0 | 0 | 1 | 0 | 1 | 0 | 0 | 0 | 0 | 0 |
| 13 | 1 | 0 | 1 | 1 | 0 | 0 | 0 | 0 | 0 | 1 | 1 | 0 | 1 | 0 | 0 | 0 | 0 | 0 |
| 14 | 0 | 1 | 1 | 1 | 0 | 0 | 0 | 0 | 0 | 1 | 0 | 0 | 1 | 0 | 0 | 0 | 0 | 0 |
| 15 | 1 | 1 | 1 | 1 | 0 | 0 | 0 | 0 | 0 | 0 | 0 | 0 | 1 | 0 | 0 | 0 | 0 | 0 |
| ⋮ | | | | | | | | | | | | | | | | | | |
| 496 | 0 | 0 | 0 | 0 | 1 | 1 | 1 | 1 | 1 | 0 | 0 | 0 | 1 | 0 | 0 | 0 | 0 | 1 |
| 497 | 1 | 0 | 0 | 0 | 1 | 1 | 1 | 1 | 1 | 1 | 0 | 0 | 1 | 0 | 0 | 0 | 0 | 1 |
| 498 | 0 | 1 | 0 | 0 | 1 | 1 | 1 | 1 | 1 | 1 | 1 | 0 | 1 | 0 | 0 | 0 | 0 | 1 |
| 499 | 1 | 1 | 0 | 0 | 1 | 1 | 1 | 1 | 1 | 0 | 1 | 0 | 1 | 0 | 0 | 0 | 0 | 1 |
| 500 | 0 | 0 | 1 | 0 | 1 | 1 | 1 | 1 | 1 | 0 | 1 | 1 | 1 | 0 | 0 | 0 | 0 | 1 |
| 501 | 1 | 0 | 1 | 0 | 1 | 1 | 1 | 1 | 1 | 1 | 1 | 1 | 1 | 0 | 0 | 0 | 0 | 1 |
| 502 | 0 | 1 | 1 | 0 | 1 | 1 | 1 | 1 | 1 | 1 | 0 | 1 | 1 | 0 | 0 | 0 | 0 | 1 |
| 503 | 1 | 1 | 1 | 0 | 1 | 1 | 1 | 1 | 1 | 0 | 0 | 1 | 1 | 0 | 0 | 0 | 0 | 1 |
| 504 | 0 | 0 | 0 | 1 | 1 | 1 | 1 | 1 | 1 | 0 | 0 | 1 | 0 | 0 | 0 | 0 | 0 | 1 |
| 505 | 1 | 0 | 0 | 1 | 1 | 1 | 1 | 1 | 1 | 1 | 0 | 1 | 0 | 0 | 0 | 0 | 0 | 1 |
| 506 | 0 | 1 | 0 | 1 | 1 | 1 | 1 | 1 | 1 | 1 | 1 | 1 | 0 | 0 | 0 | 0 | 0 | 1 |
| 507 | 1 | 1 | 0 | 1 | 1 | 1 | 1 | 1 | 1 | 0 | 1 | 1 | 0 | 0 | 0 | 0 | 0 | 1 |
| 508 | 0 | 0 | 1 | 1 | 1 | 1 | 1 | 1 | 1 | 0 | 1 | 0 | 0 | 0 | 0 | 0 | 0 | 1 |
| 509 | 1 | 0 | 1 | 1 | 1 | 1 | 1 | 1 | 1 | 1 | 1 | 0 | 0 | 0 | 0 | 0 | 0 | 1 |
| 510 | 0 | 1 | 1 | 1 | 1 | 1 | 1 | 1 | 1 | 1 | 0 | 0 | 0 | 0 | 0 | 0 | 0 | 1 |
| 511 | 1 | 1 | 1 | 1 | 1 | 1 | 1 | 1 | 1 | 0 | 0 | 0 | 0 | 0 | 0 | 0 | 0 | 1 |

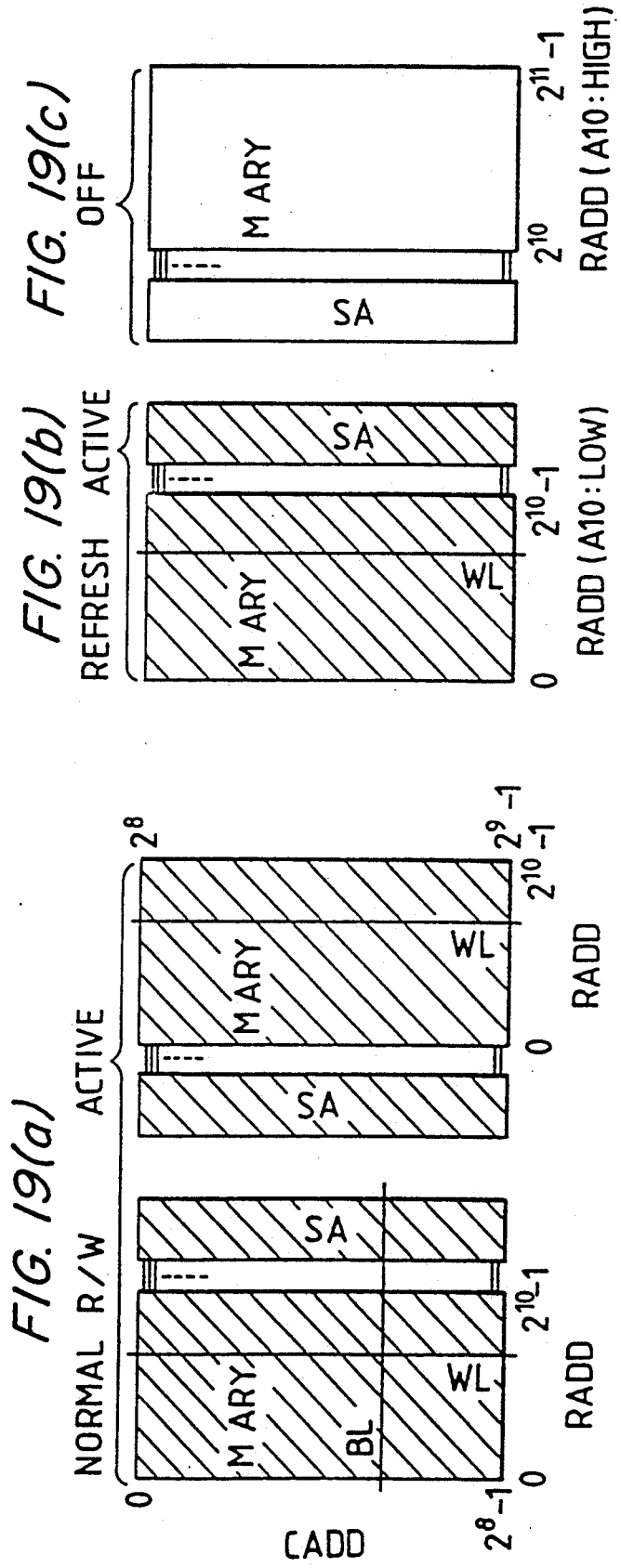

SEMICONDUCTOR MEMORY DEVICE

This is a divisional of application Ser. No. 754,019, filed Sep. 3, 1991, which is a continuation of application Ser. No. 496,258, filed on Mar. 20, 1990 now U.S. Pat. No. 5,115,413.

BACKGROUND OF THE INVENTION

This invention relates to a semiconductor memory device, and a redundancy system and a layout system therefor. More particularly, it relates to techniques which are effective when utilized for, for example, a multi-port (dual-port) memory having a random input-/output port and a serial input/output port.

A multi-port memory having both a random access port and a serial access port is stated in, for example, "NIKKEI ELECTRONICS", pp. 243-264 issued on Mar. 24, 1986 by Nikkei McGraw-Hill Kabushiki-Kaisha.

Wilh the progress of computer graphics, the development of a multi-port memory of enlarged storage capacity and heightened operating speed is requested for the color display of high resolution.

SUMMARY OF THE INVENTION

An object of this invention is to provide a semiconductor memory device having a plurality of ports, the storage capacity of which is enlarged and the operating speed of which is heightened.

Another object of this invention is to provide a layout system which is suited to enlarging a storage capacity and heightening an operating speed.

Another object of this invention is to provide a redundancy system which can realize an enhanced available percentage for the manufacturing yield of a multi-port memory of enlarged storage capacity and heightened operating speed.

The above and other objects and novel features of this invention will become apparent from the description of the specification when read in conjunction with the accompanying drawings.

Typical aspects of performance of this invention are briefly summarized as follows: In a multi-port memory having both random input/output functions and serial input/output functions, each of at least serial input/output lines is divided into two parts at the middle point thereof, and input/output circuits are provided at both the ends of each of the parts. In a serial read mode, a column selecting circuit for random access is simultaneously operated, and head data for a serial output is delivered by passing the signal of the random-access selector circuit through a serial output circuit. A serial selector for connecting signal lines for serial use and a data latch circuit is controlled in accordance with select signals which are formed by a Gray code counter. When a serial input/output select signal corresponding to a defective bit has been detected, a data latch corresponding to a redundant bit line is selected instead of the defective bit. Random input/output functions and serial input/output functions are both possessed, each memory mat is divided into two, upper and lower parts in the direction of serial input/output lines, and amplifier circuits and data buses are arranged on right and left sides with respect to the memory mats and in correspondence with the divided serial input/output lines. A serial input/output circuit which is shared by a plurality of memory mats is comprised, and that bit line in the nonselected memory mat which is interposed between the selected memory mat and the serial input/output circuit is used as a signal transmission path, while a sense amplifier which is provided in the nonselected memory mat is operated as an amplifier circuit for the corresponding signal transmission. A serial input/output circuit which is shared by a plurality of memory mats is comprised, and a bit line for parallel data transfer, which is used in common by the plurality of memory mats, is laid. Refreshing address signals are internally generated, whereby the number of memory mats which are simultaneously activated in a refresh mode is made smaller than in a normal mode.

According to the above expedients, even in a case where the storage capacity of a semiconductor memory device is enlarged, the load thereof lightens in correspondence with the division of the serial input/output line in two, so that a high-speed serial input/output operation can be performed. The head data for the serial output is delivered through the random-access selector circuit, whereby the response of the memory device can be quickened. The use of the Gray code can attain a higher operating speed and can minimize coupling noise. The available percentage of the memory device in manufacture can be heightened by remedying bit line defects. The memory mat is divided into the upper and lower parts in the direction of the serial input/output lines, whereby a heightened operating speed becomes possible. A higher density of integration is permitted by utilizing the bit line and sense amplifier of the nonselected memory mat as the parallel transfer path. A larger storage capacity is permitted by the bit line for the parallel data transfer, which is used in common by the plurality of memory mats. The power consumption of the memory device is permitted to lower by the refresh signals which are internally generated.

BRIEF DESCRIPTION OF THE DRAWINGS

FIG. 9 is a table for explaining a code converting operation in the code converter circuit;

FIG. 19 is a schematic block diagram for explaining an embodiment of a normal mode as well as a refresh mode in a semiconductor memory device according to this invention;

DESCRIPTION OF THE PREFERRED EMBODIMENTS

Figure 1:
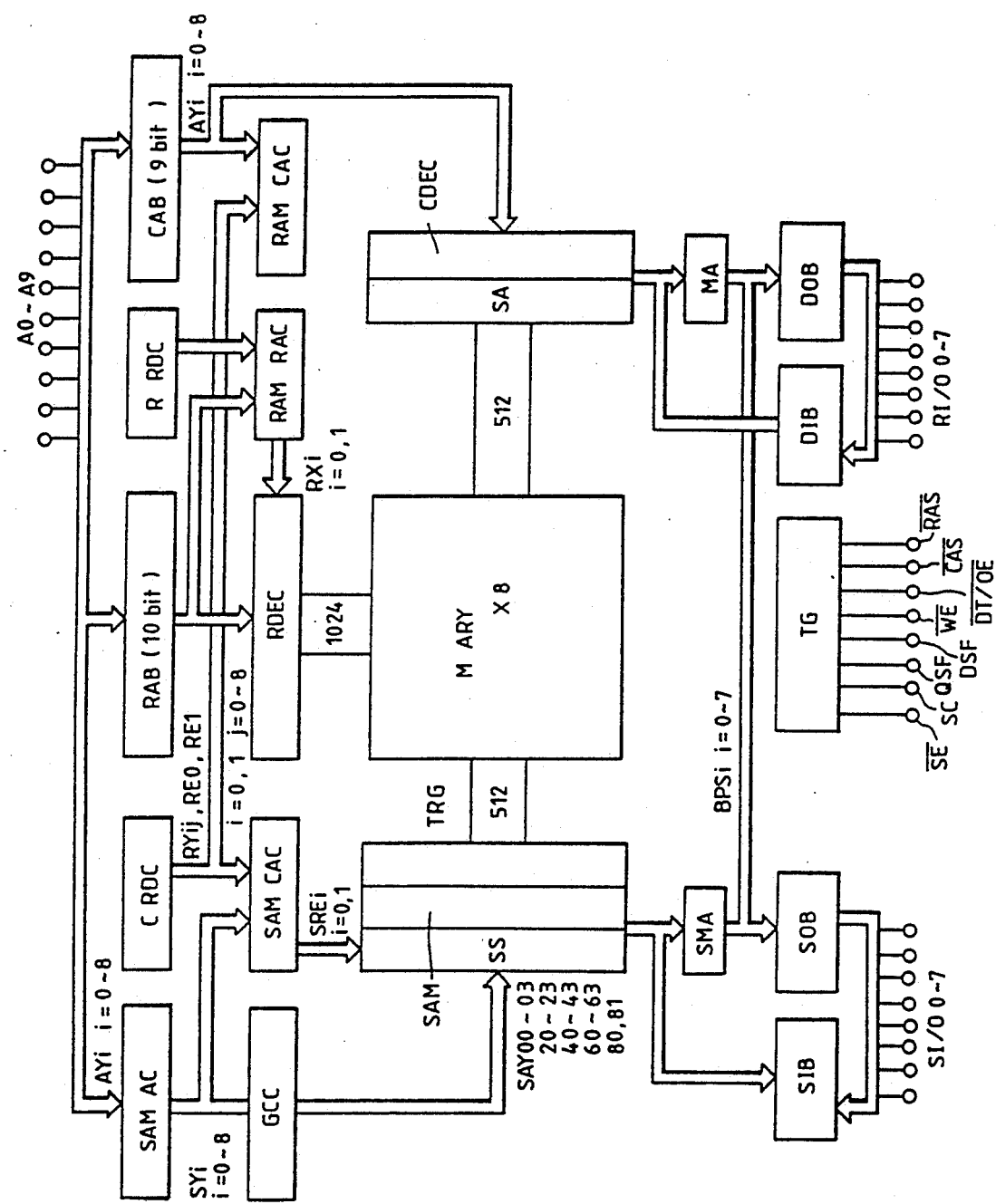
FIG. 1 is a circuit function block diagram showing an embodiment of a multi-port memory according to this invention.

Shown in FIG. 1 is a block diagram of an embodiment of a multi-port memory according to this invention.

The figure is the block diagram expressed in terms o circuit functions, and a memory array MARY for random access is endowed with a storage capacity of 1024 (rows)×512 (columns) #500 K though not especially restricted. Such memory arrays MARY numbering eight are accessed in parallel, whereby color data composed of (×8) bits is stored as unit data. Using two such multi-port memories, therefore, color picture data in 256 colors can be stored at a high resolution of, e.g., 1024×1024.

The embodiment includes address terminals A0-A9 of 10 bits. Row-group and column-group address signals are time-serially input in synchronism with a row address strobe signal $\overline{RAS}$ and a column address strobe signal $\overline{CAS}$, respectively. The row address signals AXi are accepted into a row address buffer RAB, while the column address signals AYi are accepted into a column address buffer CAB or a serial address counter SAMAC. On this occasion, the address signal A9 at the most significant bit is invalidated because there are only 512 column addresses as described above.

Using the input column address as an initial value, the serial address counter SAMAC performs a count operation in synchronism with serial clock pulses The resulting count output is applied to a Gray code counter GCC, in which it is converted into a Gray code. The address signals for serial use, converted into the Gray code, are used as a signal for selecting a serial selector SS.

A serial access memory SAM includes a data latch circuit, and the serial selector SS is interposed between the input/output nodes of the memory SAM and serial input/output lines extended in the vertical direction as viewed in the figure, (i.e., parallel to the longitudinal axis of the serial access memory SAM), In addition, the input/output nodes are connected to the 512 bit lines of the memory array MARY through a transfer gate TRG. Accordingly, data items are transferred in parallel in 512-bit unit mutually between the memory array MARY for random access and the serial access memory SAM.

A serial main amplifier SMA includes eight unit circuits, which amplify serial data items transmitted through the serial input/output lines and deliver them out of data terminals for serial use Si/O 0-7 through a serial output circuit SOB.

Serial write data items received as inputs at the serial-use data terminals SI/O 0-7 are transmitted to the serial input/output lines through a serial input circuit SIB, and they are written into those addresses of the serial access memory SAM which are designated by the serial selector SS.

The address signals accepted into the row address buffer RAB are input to a row decoder RDEC, in which they are decoded so as to select one of the word lines of the memory array MARY.

The address signals accepted into the column address buffer CAB are input to a column decoder CDEC, in which they are decoded so as to form a signal for selecting one of the bit line pairs of the memory array MARY. Although omitted from the figure, a column switch circuit is provided in the column decoder CDEC. The column switch circuit is switched and controlled by the above select signal, thereby to connect one pair of bit lines to input/output lines for random use. A main amplifier MA amplifies the signals of the random-use input/output lines, and applies them to a random-use data output circuit DOB. The random-use data output circuit DOB delivers the read signals out of data terminals for random use RI/O 0-7.

Random write data items received at the random use data terminals RI/O 0-7 are transmitted to the random-use input/output lines through a random input circuit DIB, and are transmitted to the bit line pair of the memory array MARY through the selected column switch circuit. Since one memory cell is coupled to the bit line pair through the operation of selecting the word line, the data is written thereinto.

This embodiment is provided with a signal path by which the output signals of the main amplifier for random use MA are transmitted to the input node of the serial-use data output circuit SOB. The reason therefor is as follows: The head data items for the serial output are transferred to the serial access memory SAM in parallel through the transfer gate TRG as stated above, and are thereafter transmitted to the input node of the output circuit SOB through the serial selector SS as well as the main amplifier SMA. Thus, the delivery of the head data items slows without any contrivance. In this embodiment, therefore, the column address signals for designating the head address are also accepted into the column address buffer CAB, and the column select operation is performed by the column decoder CDEC. In this way, the data items of the designated head address are quickly delivered through the random-use column switch circuits as well as the main amplifier MA. The signals of these data items are transmitted to the input node of the serial output circuit SOB via the signal path. Thus, the data group for the serial output is delivered at high speed. While the head data items for the serial output are delivered to the data terminals SIO 0-7 through the random-use column switch circuits, the main amplifier MA, and the serial-use data output circuit 50B, the delivery of the next data group for the serial output from the serial access memory SAM to the serial-use data output circuit 50B is prepared by the serial circuits including the serial selector SS. Therefore, the select operations of the serial output operation as in the processing of the head data items are made dummy or are omitted.

Moreover, in this embodiment, the pipeline transfer is carried out between the serial address counter SAMAC and the Gray code counter GCC receiving the outputs of the former to form Gray code signals, in order to realize a high-speed serial output operation. More specifically, binary address signals are sent from the counter SAMAC, and as soon as the counter GCC receives them, the counter SAMAC performs an incremental operation of +1. The output portion of the counter GCC is provided with a decoder circuit, which forms a select signal for selecting one serial selector SS. Also here, the pipeline transfer is carried out as will be described later with reference to FIG. 7. Although not shown in the figure, a data latch circuit is provided at the output portion of the serial-use main amplifier SMA. Thus, as soon as data to be output from the main amplifier SMA is accepted into the data latch, this main amplifier SMA starts the operation of amplifying serial data which is to be subsequently output. Here, pipeline processing proceeds in such a manner that, in parallel with the amplify operation, the serial-use data output circuit SOB delivers the data accepted into the data latch.

The speed of the serial output operation is permitted to heighten by the three stages of pipeline processing as stated above.

Meanwhile, in the case where the storage capacity of the memory is enlarged as described before, the probability of being attended with defective bits becomes higher. A row-group defective address storage circuit RRDC stores the defective addresses in terms of the burnout of fuses or the like. The defective address and the row address accepted into the address buffer RAB are input to an address comparator circuit RAMRAC. When a memory access to a defective word line is detected in the address comparator circuit RAMRAC, the detection output of this comparator circuit is input to the row decoder RDE,, whereby the operation of selecting the address of the defective word line is inhibited and is changed-over to the operation of selecting a spare word line. In this way, the defective bits of the row group can be remedied.

In the multi-port memory of the prior art, no measure is taken for bit line defects, such as the breaking and short-circuiting of bit lines, from the standpoint of performing the successive serial input/output operations of data. However, in the case where the storage capacity is rendered as large as about 4 Mbits as described before, the probability of the occurrence of such defects rises inevitably, and the available percentage of the articles of the product worsens when the defects are left intact. In this embodiment, therefore, a redundancy circuit is provided also for the column group.

Likewise to the above, a column-group defective address storage circuit CRDC has defective addresses programmed therein in terms of the burnout of fuses or the like. In the serial mode, the defective address and the address signals generated by the serial address counter SAMAC are input to an address comparator circuit SAMCAC. When a memory access to a defective bit line is detected as in the foregoing here, the resulting detection signal is input to the serial selector SS, whereby the serial access memory SAM corresponding to the defective bit line is inhibited from being selected, and the memory SAM corresponding to a spare bit line is selected. On the other hand, in the random mode, the defective address and the address accepted into the address buffer CAB are input to the address comparator circuit RAMRAC. In the case of the memory access to the defective bit line, the column corresponding to the defective bit line is inhibited from being selected, and the column switch corresponding to the spare bit line is selected. The bit line defects are also remedied in this way, whereby the available percentage of the multi-port memory in manufacture can be heightened.

A timing generator circuit TG receives various control signals $\overline{RAS}$, $\overline{CAS}$, $\overline{DTOE}$, $\overline{WE}$, DSF, QSF, SC and $\overline{SE}$ supplied from external terminals, so as to decide the operation modes of the multi-port memory and to generate the operation timing signals of the internal circuits in accordance with the operation modes. As referred to before, the signal $\overline{RAS}$ is the row address strobe signal, and the signal $\overline{CAS}$ is the column address strobe signal. The signal $\overline{WE}$ is a write enable signal, the signal $\overline{DT/OE}$ is a data transfer control signal, the signal SC is a serial clock signal, and the signal $\overline{SE}$ is a serial enable signal.

Figure 2:
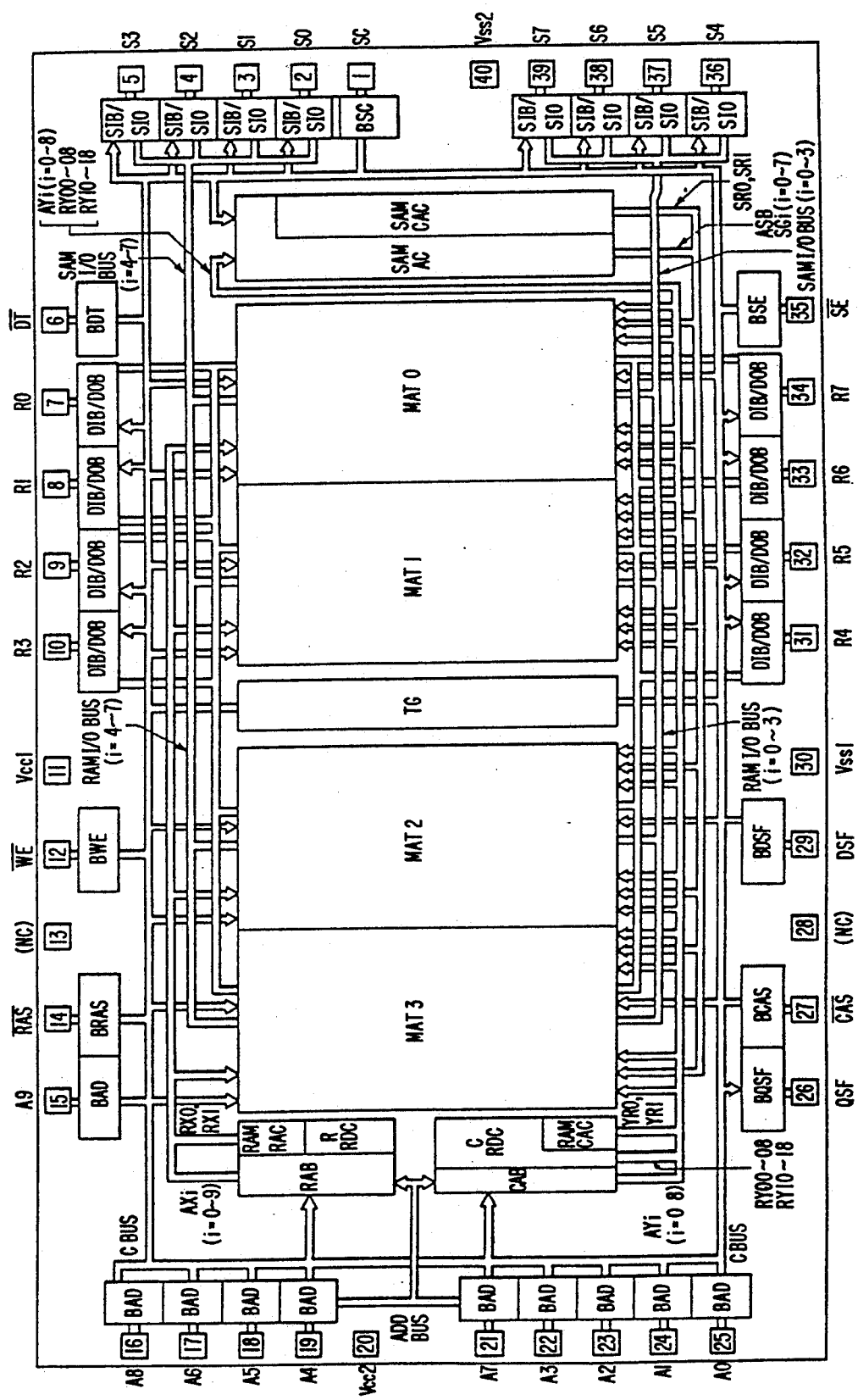
FIG. 2 is a layout diagram showing a practicable embodiment of the multi-port memory.
Figure 33:
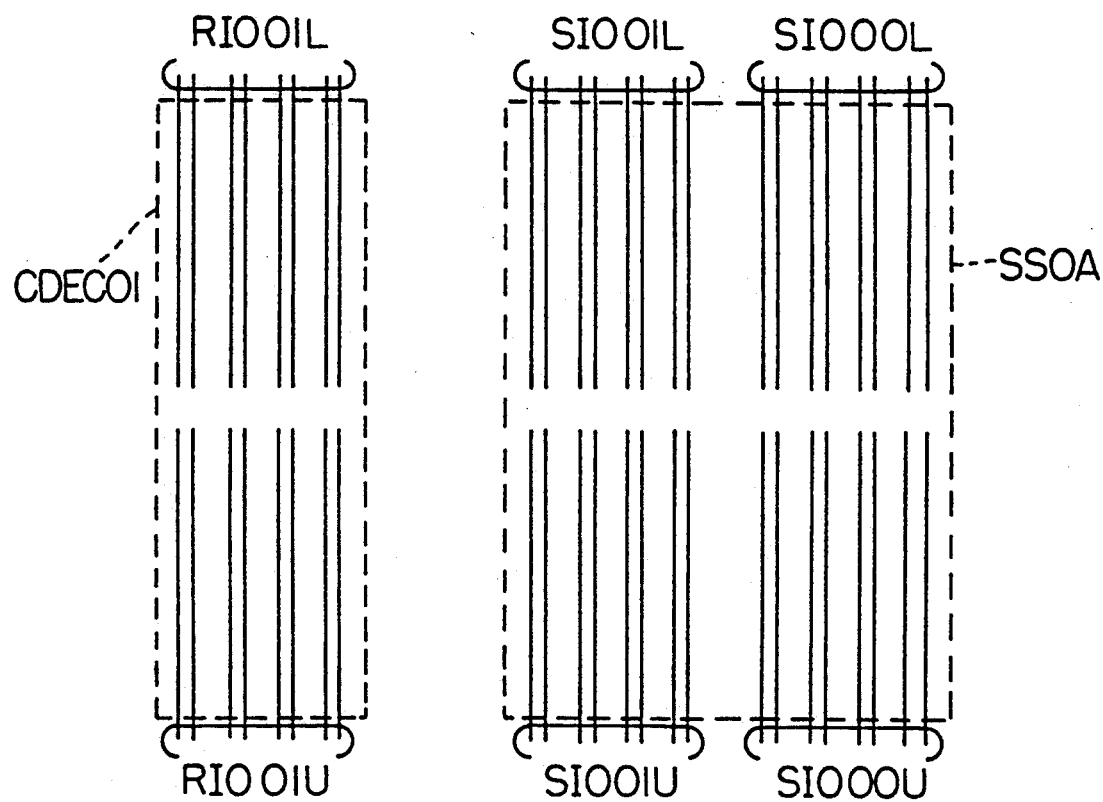
FIG. 33 shows the division of the serial input/output lines and the random input/output lines at respective middle portions thereof.

FIG. 2 shows a layout diagram of a practicable embodiment of the multi-port memory. Various circuit blocks and terminals in the figure are depicted in conformity with the geometrical arrangement thereof on an actual semiconductor chip. In this embodiment, in order to heighten the operating speed of the multi-port memory while the storage capacity is enlarged as stated before, each of memory mats MAT0 thru MAT3 in the total number of four, which are so distributed that every two of them lie on each of the right and left sides of the drawing with respect to the timing generator circuit TG, is vertically divided so as to divide each of the serial input/output lines into two equal parts at the middle point thereof (noting that the vertical direction corresponds to the longitudinal axis of each of the memory mats shown in FIG. 2). FIG. 33 shows the divisiion of both the serial input/output lines and the random input/output lines at middle points thereof. Owing to such division, the length of each of the input/output lines which are extended in the vertical direction as viewed in the figure can be halved. The parasitic capacitances of the input/output lines can be reduced accordingly, so that the transfer rate of data items to be serially input/output can be raised.

Buses are dividedly laid above and below the memory mats MAT0-MAT3. The buses include address buses, data buses, and control buses for transmitting various control signals. Circuits, for example, BRAS and BAD, corresponding to individual terminals are respectively corresponding input buffers, and circuits DIB/DOB are input/output buffers The address buffers RAB, CAB, SOB etc. stated before include the corresponding input buffers and input/output buffers. In the case where such division into the two, upper and lower parts or groups is done, also the random input/output operations can have their speeds heightened.

Incidentally, when merely the serial high-speed operation is intended, the random access section (including the random input/output lines) need not be divided into the two, upper and lower portions as described above. In other words, the random input/output units may well be disposed on only the upper or lower region of the semiconductor chip as a matter of course.

Figure 3:
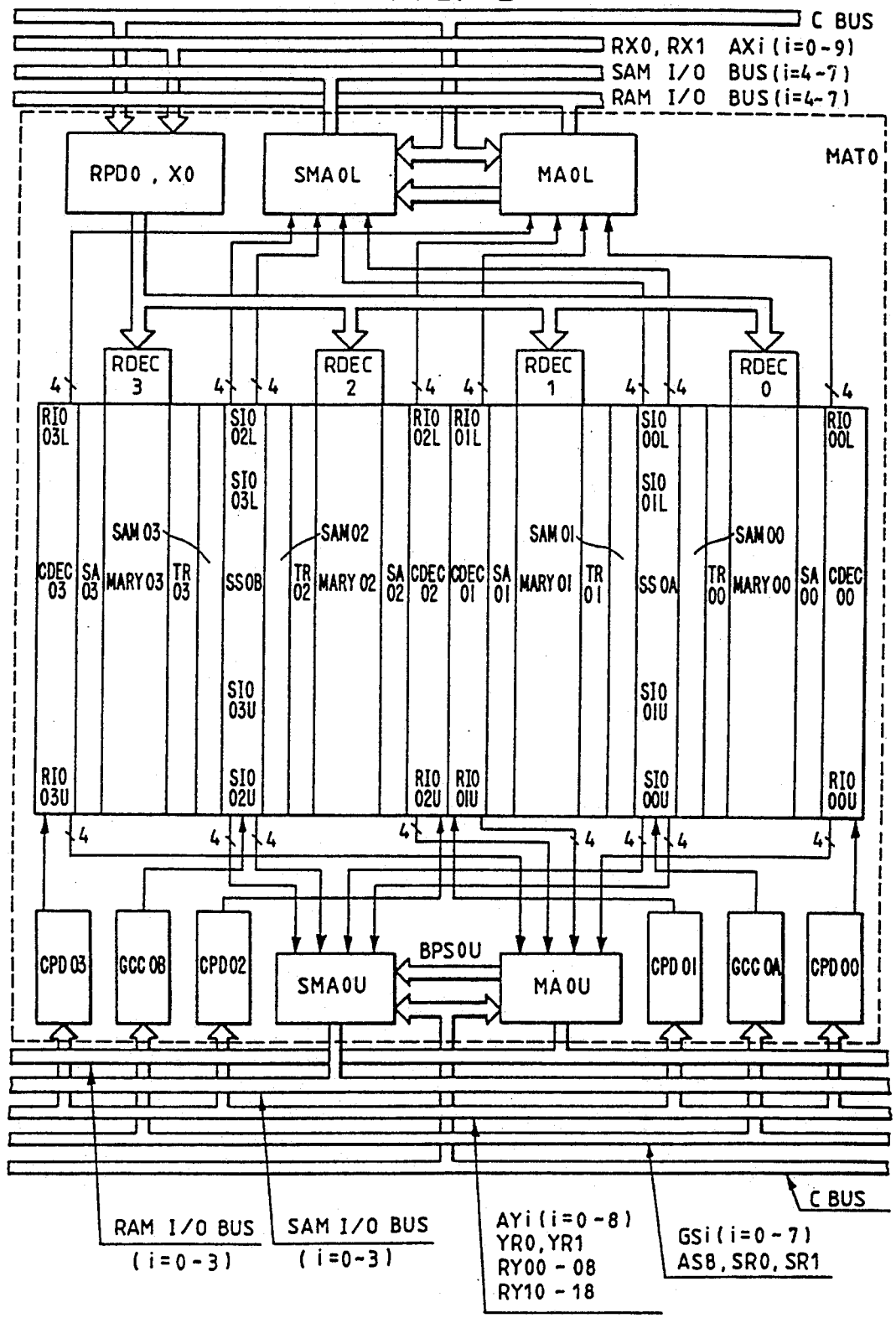
FIG. 3 is a block diagram showing an embodiment of the practicable internal arrangement of one memory mat (MATO)

FIG. 3 shows a block diagram of the practicable internal arrangement of one MAT0 of the memory mats. The other memory mats MAT1 thru MAT3 are similar in arrangement to the memory mat MAT0 typically exemplified.

Figure 34:
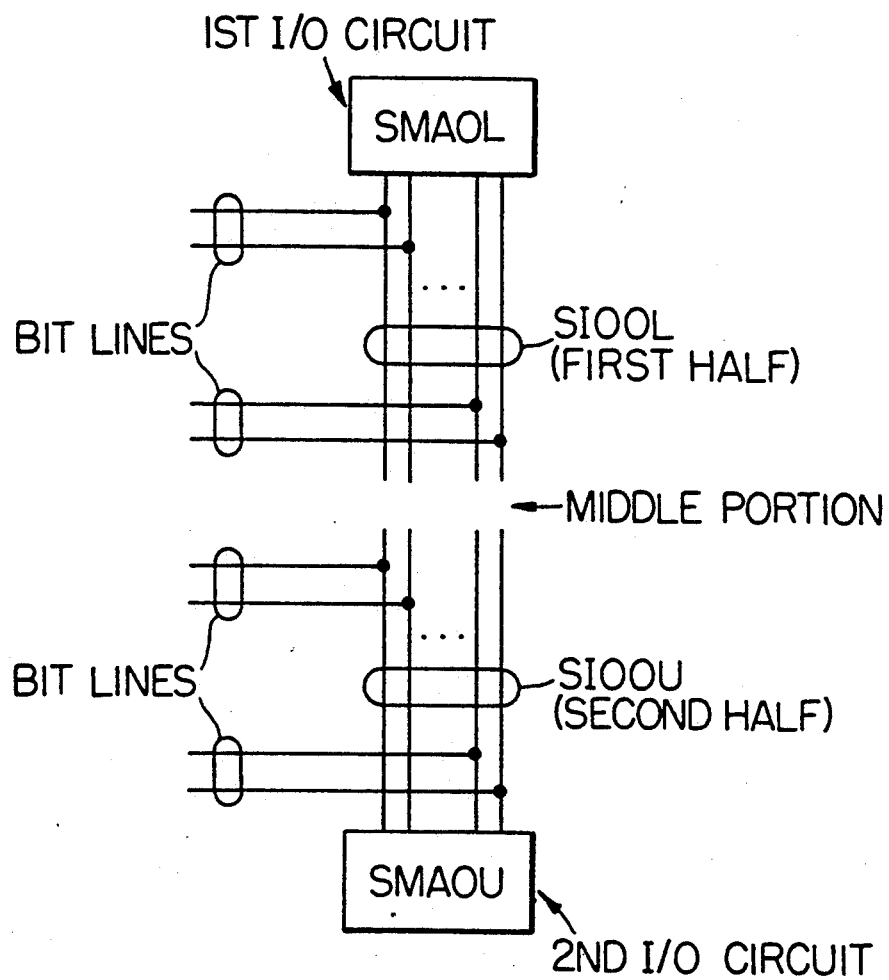
FIG. 34 shows the connection of divided serial input-/output lines to corresponding serial main amplifiers.

The memory mat MAT0 is divided in two in the lateral direction as viewed in the figure, and has two memory arrays MARY00, 01 and two memory arrays MARY02, 03 arranged on the right and left sides of the memory mat MAT0 with corresponding ones of two serial selectors SSOA and SSOB held therebetween, respectively. In correspondence with the respective memory arrays MARY00-03, there are provided four serial access memories SAM00-SAM03, sense amplifiers SA00-SA03, transfer Row decoders RDEC0-3 are provided above the memory arrays MARY00 03. Serial-use main amplifiers SAM0L, SMAOU and random-use main amplifiers MAOL, MAOU are provided at the upper and lower parts of the memory mat MAT0 in conformity with the fact that each of the serial input/output lines and each of the random input/output lines éxtended in the vertical direction in FIG. 2 is divided in two at the middle point thereof for the high speed operations as described before (e.g., see FIG. 33). In other words, the serial input/output lines extend parallel to the longitudinal axis of each of the memory arrays MARY00-03 of FIG. 3, so that the upper half of each divided serial input/output line is coupled to the upper serial-use main amplifier SMAOL and the lower half of each divided serial input-/output line is coupled to the lower serial-use main amplifier SMAOU (see FIG. 34). A similar arrangement is provided in FIG. 3 for the random I/0 lines, although this is optional.

Symbols GCC0A and GCC0B denote Gray code counters corresponding to the respective serial selectors SSOA and SSOB. Symbols CPD01 thru CPD03 denote column predecoders, and symbol RPDO denotes a row predecoder.

Figure 4:
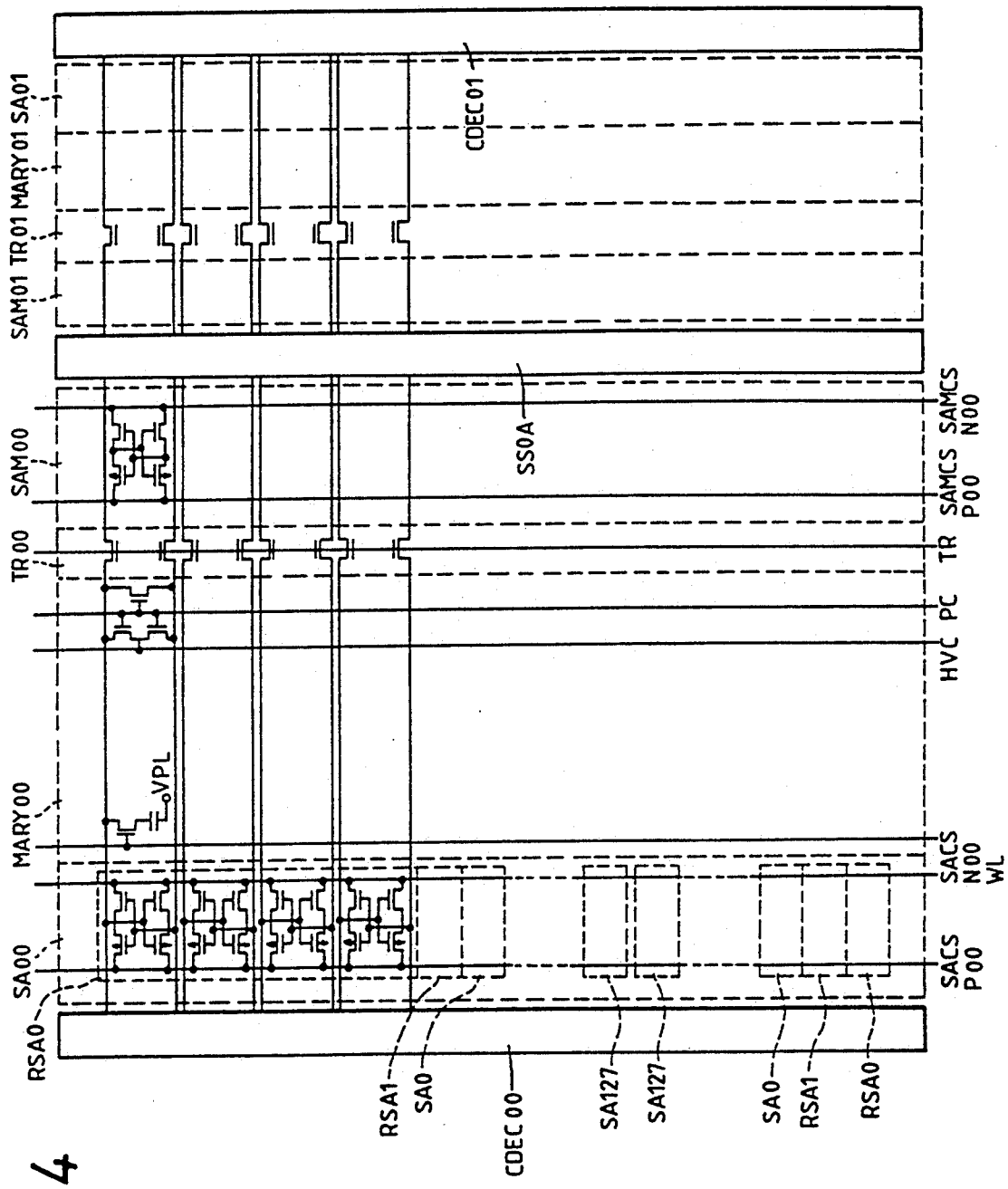
FIG. 4 is a practicable circuit diagram showing an embodiment of the memory mat.

FIG. 4 shows a practicable circuit diagram of an embodiment of the memory mat.

Depicted in the figure are practicable circuits typically exemplifying the memory array MARY00, sense amplifier SA00, transfer gate TR00 and serial access memory SAM00.

The sense amplifier SA00 employed is a known CMOS sense amplifier, and it supplies common source lines P00 and N00 with operating voltages, thereby to perform the operation of amplifying the data of the memory cell.

Each of the memory cells which are arranged in a matrix array within the memory array MARY00, includes an address selecting MOSFET and an information storing capacitor. The gate of the address selecting MOSFET is connected to the word line WL, while the drain thereof serving as the input/output node of the memory cell is connected to one of the complementary bit lines laid in parallel in one pair. Symbol HVC denotes a half precharge voltage for the bit lines, and symbol PC a precharge signal. The serial access memory SAM00 includes a CMOS latch circuit which is similar to the sense amplifier SA00.

Figure 5:
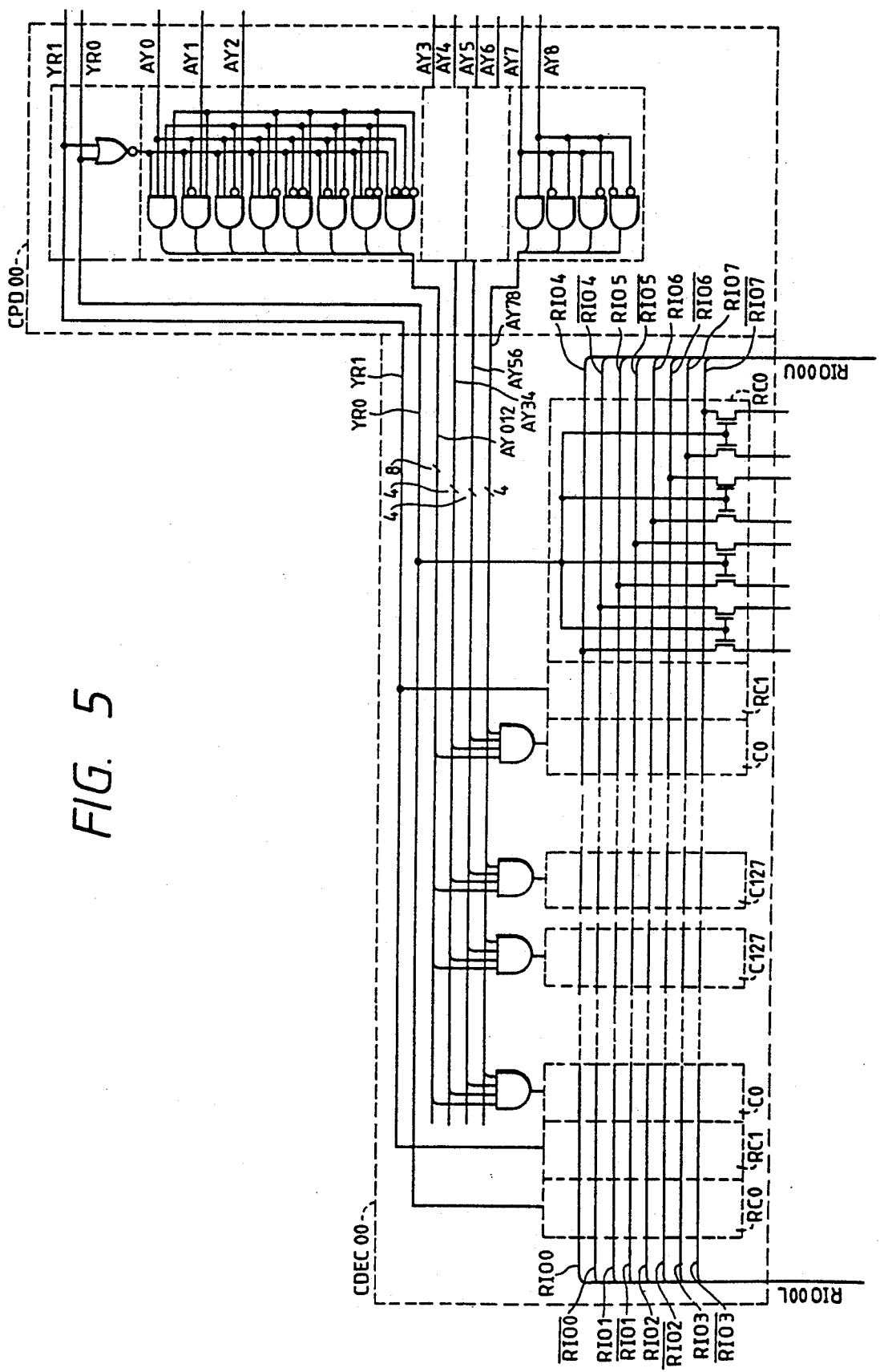
FIG. 5 is a circuit diagram showing an embodiment of a column decoder as well as a column predecoder (-and-driver)

FIG. 5 shows a circuit diagram of an embodiment of the column decoder as well as the column predecoder (serving also as a driver). Signals YR0 and YR1 are select signals for redundancy, and when they are formed, the selection of the defective bit lines is inhibited and is changed-over to the operation of selecting the spare bit lines laid in the corresponding decoder.

Figure 6:
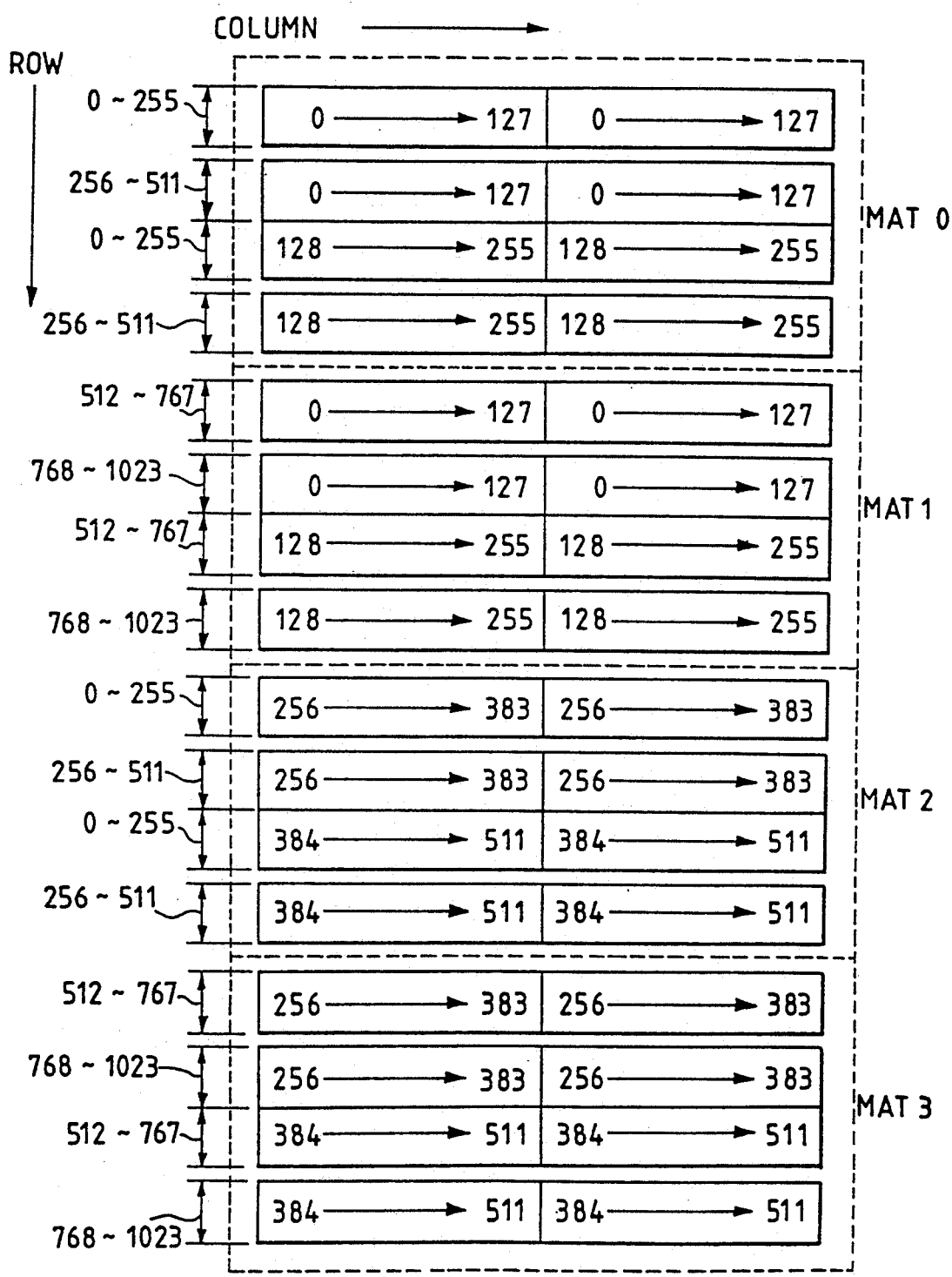
FIG. 6 is a conceptual diagram showing an embodiment of address allocation in the multi-port memory according to this invention.

Shown in FIG. 6 is a conceptual diagram of an embodiment of address allocation in the multiport memory according to this invention.

The figure corresponds to the memory mats MAT-0-MAT3 in the layout diagram shown in FIG. 2. The addresses of the row (X) group are allocated in the lateral direction as viewed in FIG. 6, while the column addresses are allocated in the vertical direction. The allocation of the 512 addresses of the column (Y) group is divided into two, upper and lower sections as indicated in the figure, and data items are transferred serially in 4-bit units from or into each serial selector. Accordingly, the serial data input/output operation can be performed in 8-bit units in total owing to the upper and lower sections.

Figure 7:
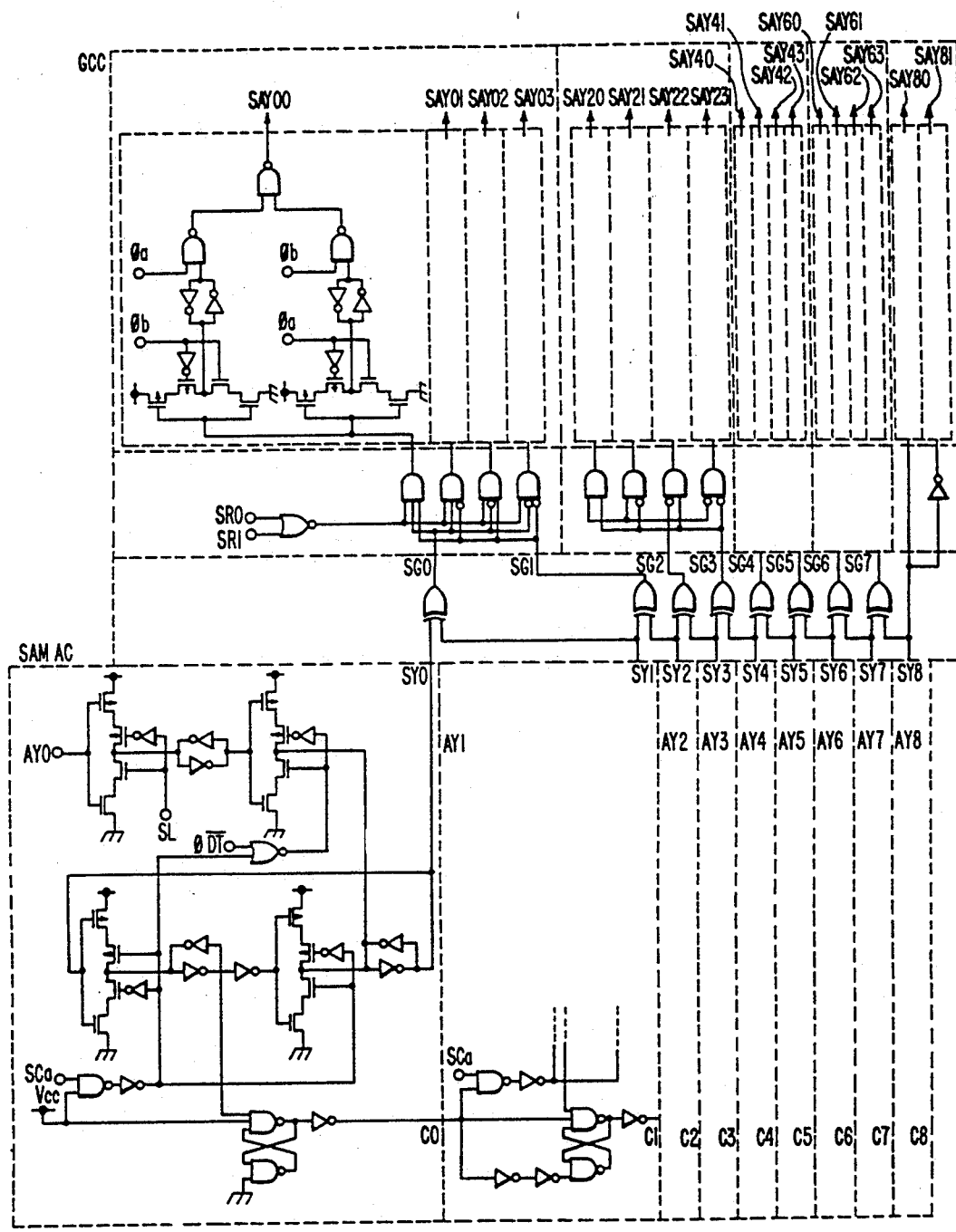
FIG. 7 is a circuit diagram showing an embodiment of a serial address counter (SAMAC) as well as a Gray code counter (GCC)

Shown in FIG. 7 is a circuit diagram of an embodiment of the serial address counter SAMAC as well as the Gray code counter GCC.

The outputs SY0-SY8 of the serial address counter SAMAC are converted into Gray codes SG0SG7 by exclusive-OR gate circuits. These Gray codes are input to a predecoder circuit including logic gate circuits, and a predecode signal is accepted into an output latch circuit. When the predecode signal is accepted into the output latch circuit, the +1 increment of the address counter SAMAC is started. When the count operation of the address counter is caused to precede in this manner, the operation of generating an address and the operation of delivering the predecode signal are equivalently executed in pipilined fashion, so that a high-speed serial transfer is permitted.

By forming the predecode signal on the basis of the Gray codes as described above, signals to change on the respective occasions of address increments are unified, and hence, reduck--ion in coupling noise can be achieved together with the higher operating speed. Moreover, a lower power consumption can be attained in accordance with the unification of the changing signals.

When supplied with redundancy portion outputs SRO and SR1, the predecoder circuit is inhibited from delivering outputs. Then, the counter SAM corresponding to the spare bit lines separately prepared is selected.

Figure 8:
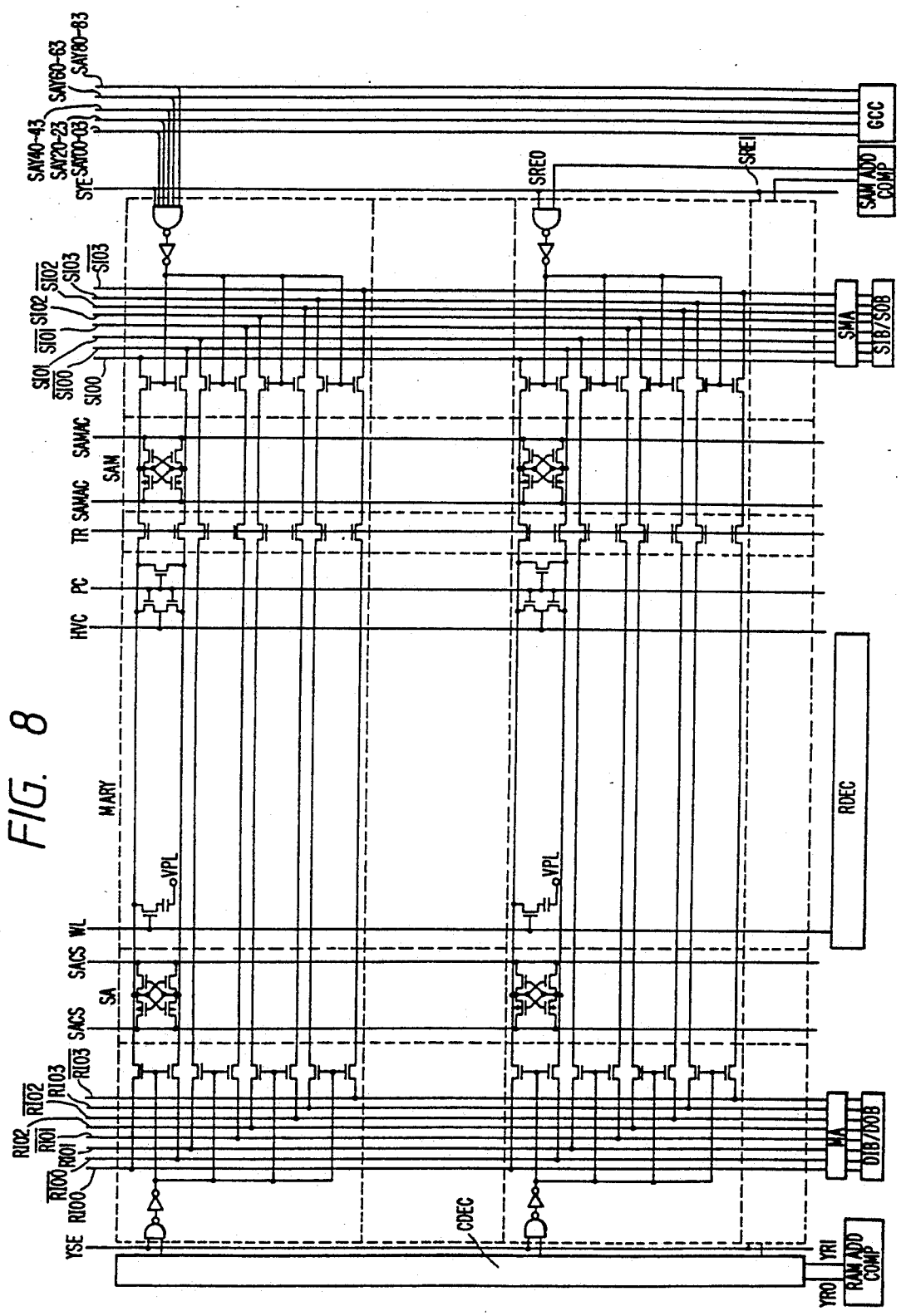
FIG. 8 is a practicable circuit diagram showing an embodiment of the memory mat.

FIG. 8 shows a practicable circuit diagram of an embodiment of the memory mats.

As stated before, the memory is accessed in 4-bit unit in conformity with the divis ion of each memory mat into the two, upper and lower portions. Therefore, the memory array MARY, serial input/output lines SIOO, $\overline{SIOO}$-SI03, $\overline{SI03}$ and random input/output lines RIOO, $\overline{RIOO}$-RI03, $\overline{RI03}$ are connected in correspondence with 4 pairs of bit lines. In consequence, the redundancy circuit is provided with 2 sets of 4 pairs of bit lines in correspondence with the redundancy portion outputs SRO and SR1 as mentioned above.

FIG. 9 shows a table for explaining the code convert operation of the code code converter circuit.

Any of the addresses 0–511 designated by the binary counter address SY0–SY8 is converted into the Gray codes SGO thru SG8. In this case, only one bit changes for one address increment operation. Therefore, the acceptance of the predecode output as stated before does not require setting a time margin as in the case of accepting the output of a binary signal, so that the high speed operation becomes possible. Moreover, since only one signal changes, the coupling noise between signal lines can be minimized, and the power consumption can be lowered.

Figure 10A:
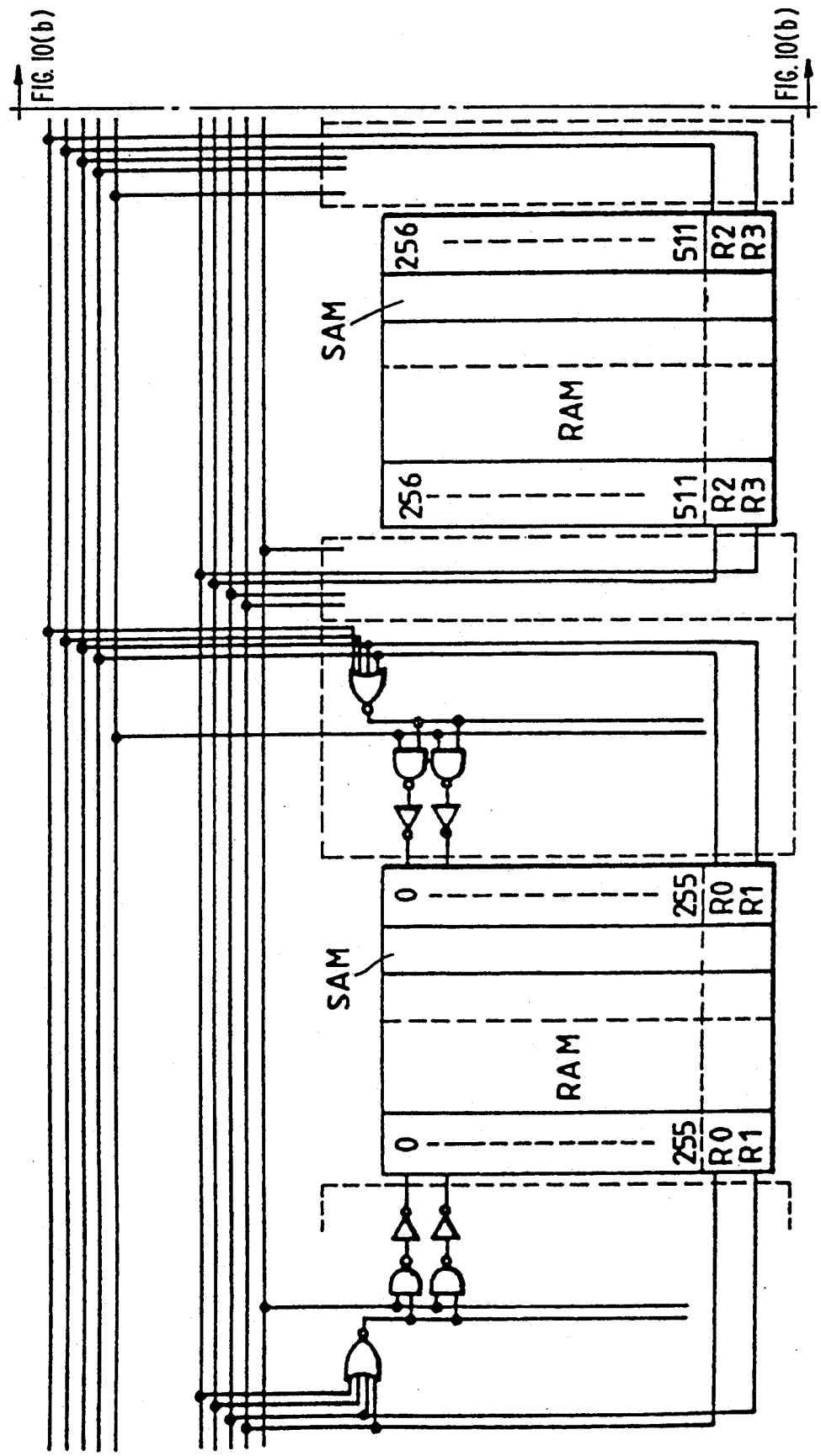
FIG. 10 is a block diagram showing an embodiment of a redundancy system for bit lines in the multi-port memory.
Figure 10B:
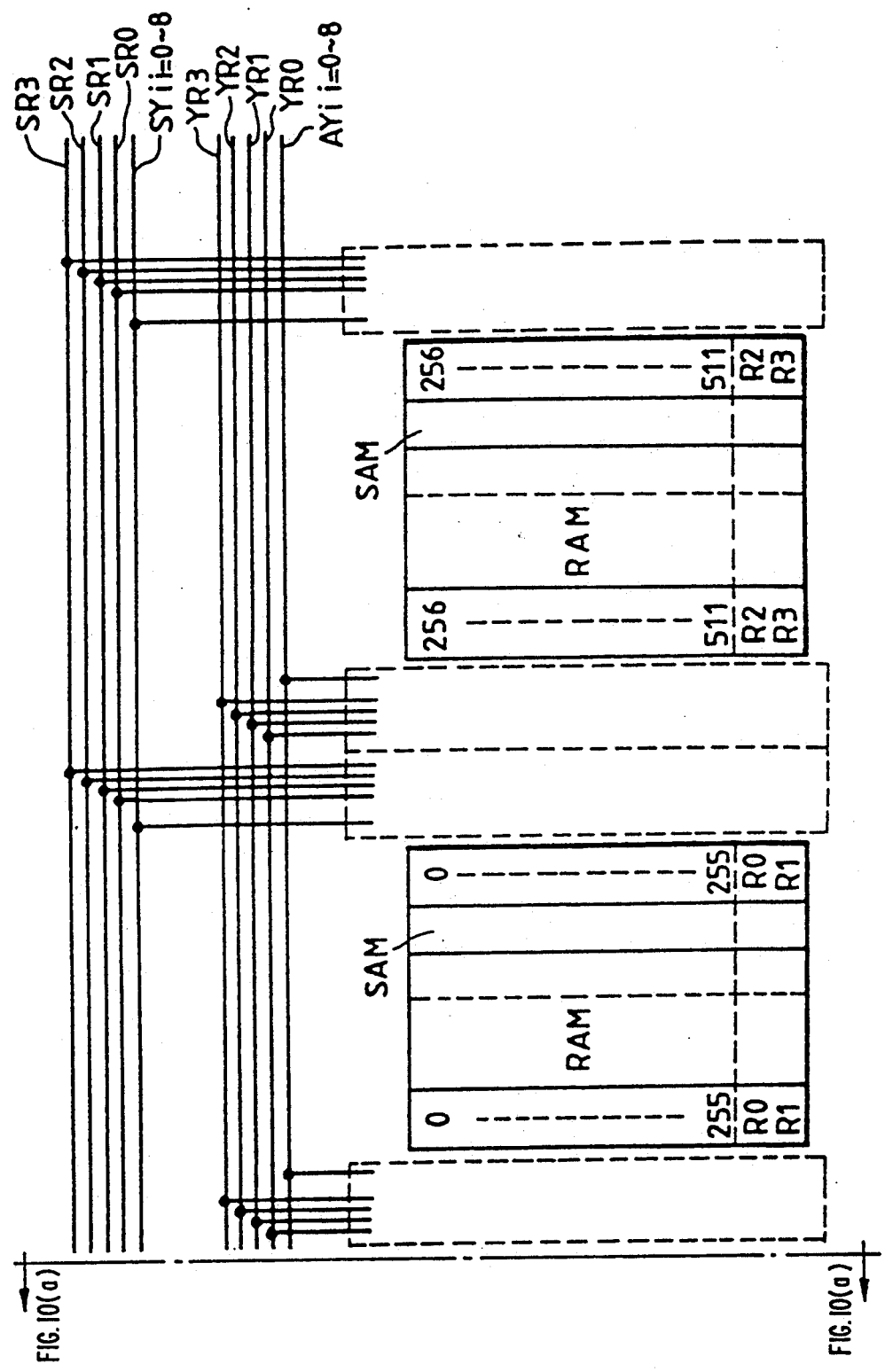

Shown in FIG. 10 is a block diagram of an embodiment of a redundancy system for the bit lines in the multi-port memory.

With the enlarged storage capacity as described before, the occurrence rate of the defects of the bit lines in the memory cell array heightens, and remedying the defects also for the bit lines becomes an indispensable requisite in order to enhance the available percentage of the articles of the product. In this embodiment, the memory cell array RAM is divided into a plurality of blocks, and two pairs of redundant bit lines are prepared for each of the blocks. Further, two of the blocks are combined into one set, and addresses 0 thru 3 are allocated to the redundant bit lines. Thus, the redundant bit lines of the blocks on the opposite side are exploited under the condition that they are not in use. That is, it is permitted to utilize the redundant bit lines mutually among the blocks. In this way, in the absence of any defect on one side, up to four pairs of defective bit lines in the blocks of the other side can be remedied. With regard to redundancy systems, and other aspects of multiport memories, reference is made to a related application filed in the United States Patent and Trademark Office on even date herewith by Katsuyuki Sato, et al, entitled Semiconductor Memory Apparatus, based on Japanese Application 1-65837 which is hereby incorporated by reference.

Figure 11A:
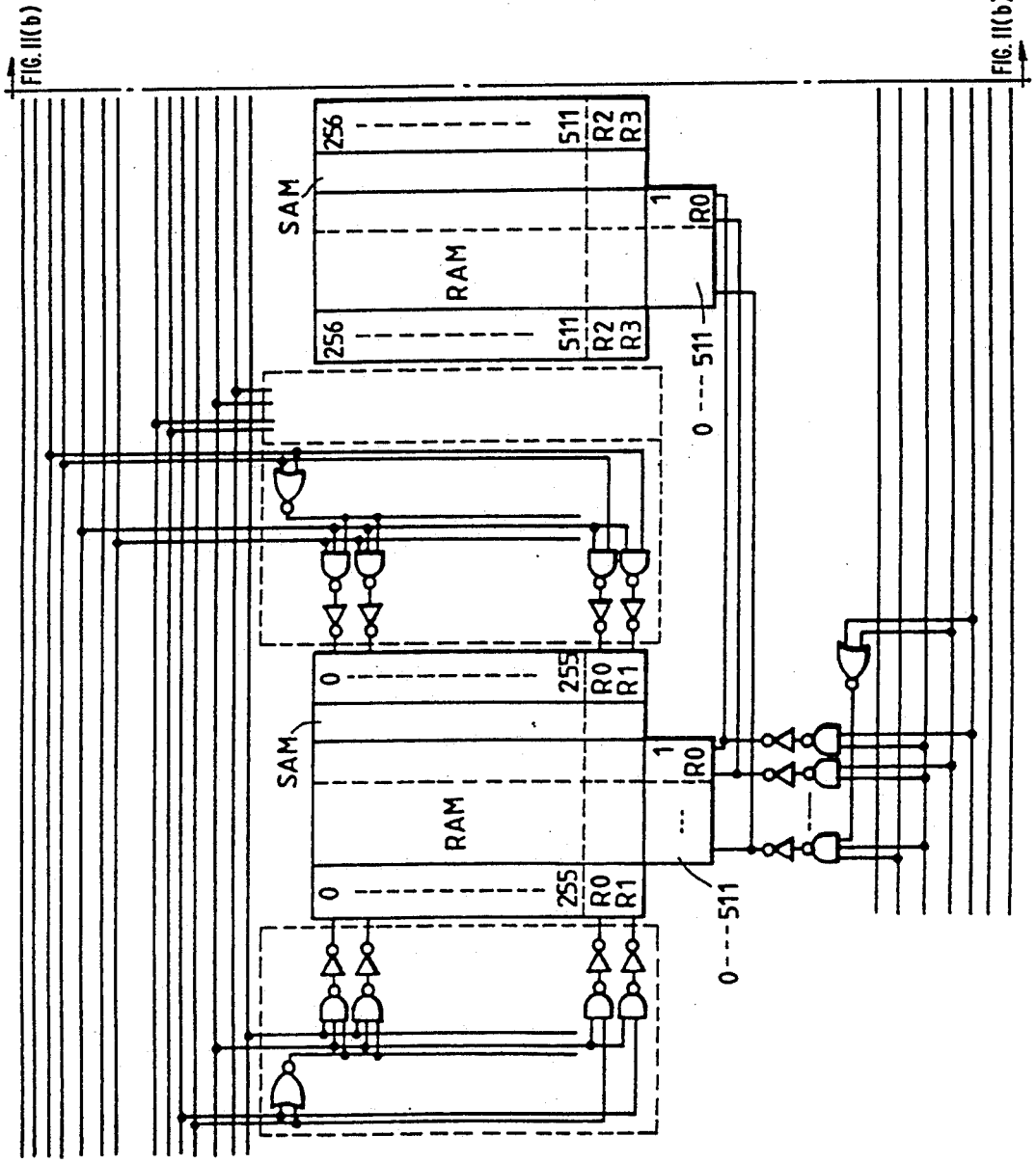
FIG. 11 is a block diagram showing another embodiment of the redundancy system for the bit lines in the multi-port memory.
Figure 11B:
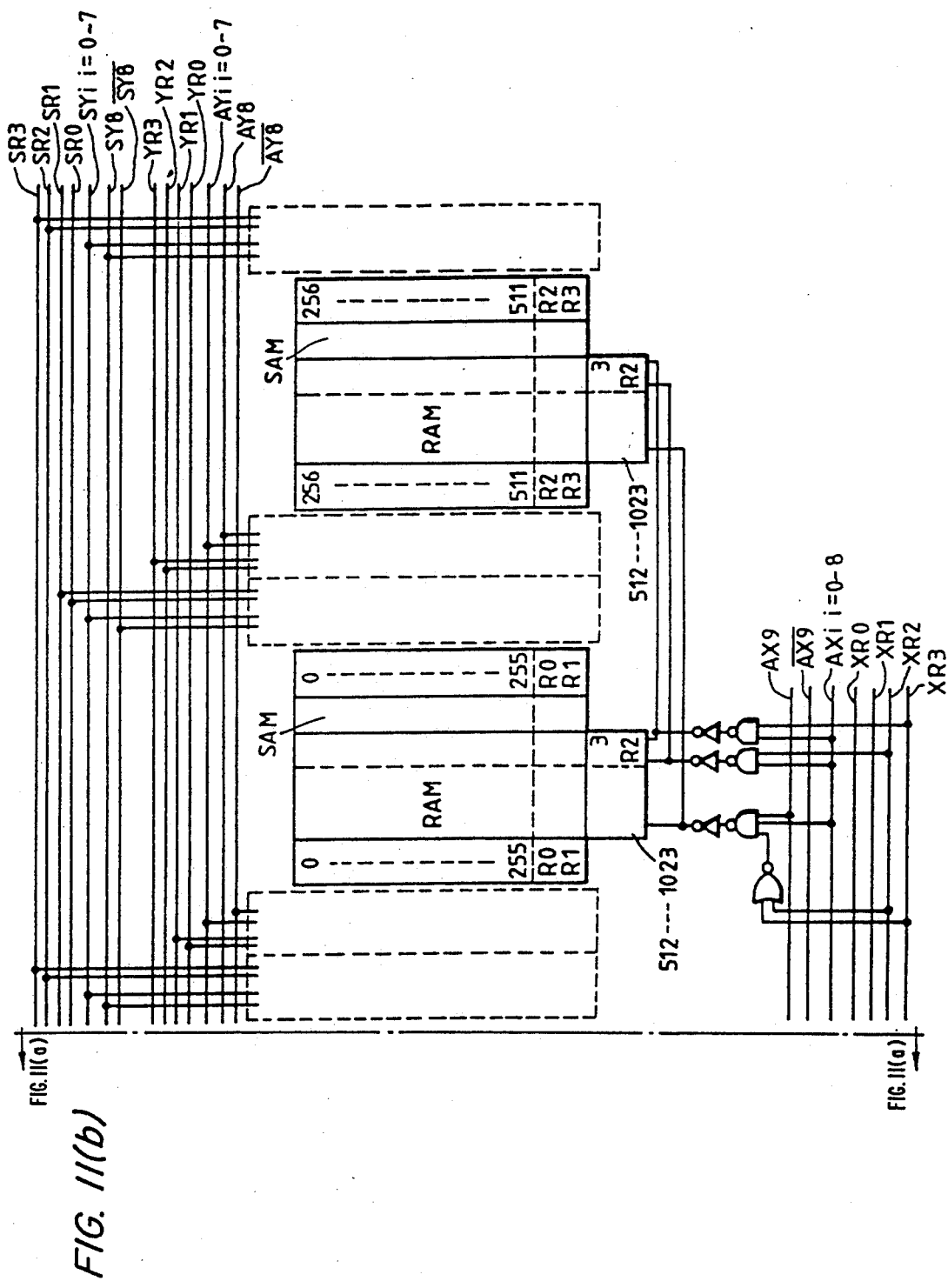

FIG. 11 shows a block diagram of another embodiment of the redundancy system for the bit lines in the multi-port memory.

In the illustrated embodiment, also the word lines are provided with redundant word lines. The redundant word lines are adapted to be shared by two blocks similarly to the above case of the bit lines, whereby the efficiency of remedying defects can be enhanced more.

Figure 12:
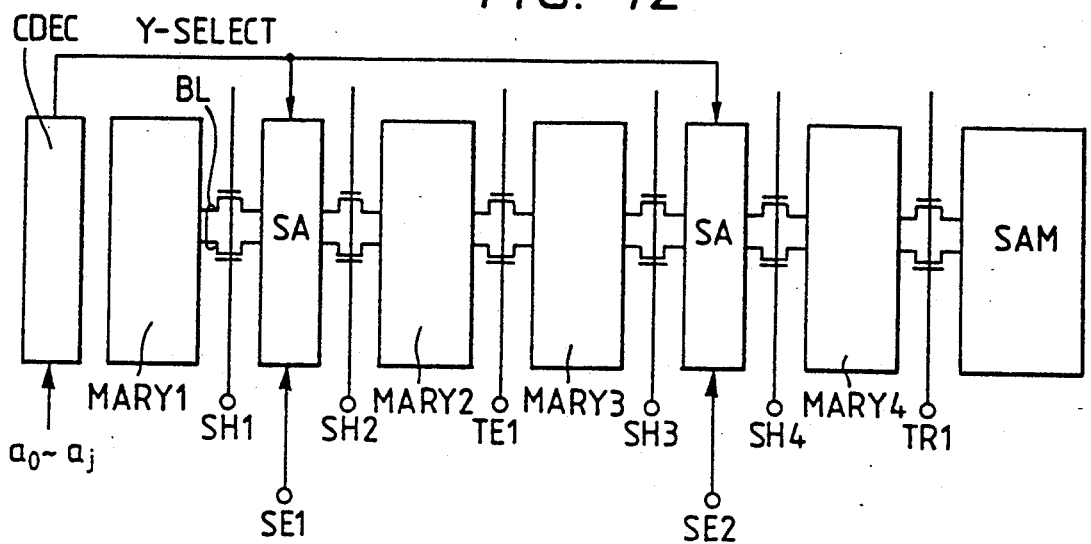
FIG. 12 is a schematic block diagram of essential portions showing another embodiment of the multi-port memory according to this invention.
Figure 13A:
FIGS. 13(a) and 13(b) are schematic timing charts for explaining the transfer operations of the embodiment in FIG. 12.
Figure 13B:

FIG. 12 shows a block diagram of another embodiment of the multi-port memory according to this invention, while FIGS. 13(a) and 13(b) show schematic timing charts of the transfer operations of the embodiment.

In this embodiment, a plurality of aligned memory arrays are disposed for a serial access memory SAM in order to attain a larger storage capacity and a higher density of integration. With this measure, the plurality of memory arrays can be brought into correspondence with the single memory SAM, so that the simplification of circuitry is realized.

More specifically, in this embodiment, with note taken of the fact that the memory arrays are activated merely in an alternative way, in other words, that only one word line is selected for the serial access memory SAM, the bit lines of the nonselected ones of the memory arrays are utilized as signal lines when the parallel transfer of data items is done across the nonselected memory arrays.

In this case, the bit lines have a parasitic capacitance of comparatively large value because the drains of the address selecting MOSFETs of a large number of memory cells are connected thereto.

Consequently, the signal transmission rate of the memory slows. Therefore, a nonselected sense amplifier is utilized as an amplifier circuit with note taken of the fact that it is similarly inactive. That is, sense amplifiers SA are activated by timing pulses for transfer SE1 and SE2 as illustrated in FIGS. 13(a) and 13(b). Here, symbols SH1–4 denote shared select signals, and symbols TE1–2 denote transfer signals provided for the transfer operation as stated above. In the normal mode of the memory, these signals are set at a low level to hold corresponding switch MOSFETs in "off" states.

With this construction, a column decoder CDEC and the serial access memory SAM can be arranged on both sides in a manner to hold the plurality of memory arrays therebetween. Therefore, the circuitry can be sharply simplified and becomes suited to the enlarged storage capacity. Incidentally, the serial access memory SAM is provided with the serial selectors as described before or with registers.

Figure 14:
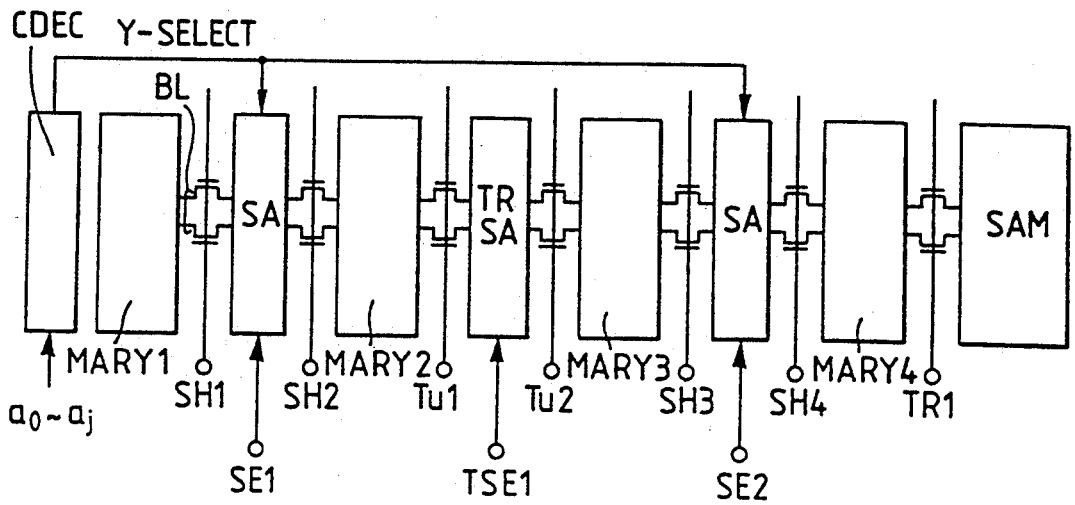
FIG. 14 is a schematic block diagram of essential portions showing another embodiment of the multi-port memory according to this invention.
Figure 15A:
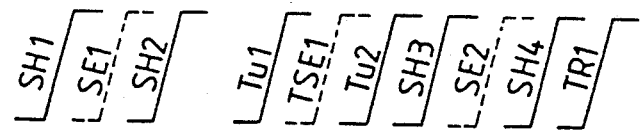
FIGS. 15(a) and 15(b) are schematic timing charts for explaining the transfer operations of the embodiment in FIG. 14.
Figure 15B:

FIG. 14 shows a block diagram of another embodiment of the multi-port memory according to this invention, while FIGS. 15(a) and 15(b) show schematic timing charts of the transfer operations of the embodiment.

In this embodiment, a dummy sense amplifier for transfer TRSA is provided in a portion which connects two pairs of memory arrays, the memory arrays of each pair holding a shared sense amplifier SA therebetween Thus, the amplifiers can be disposed at equal intervals along the signal paths for transfer.

Figure 16:
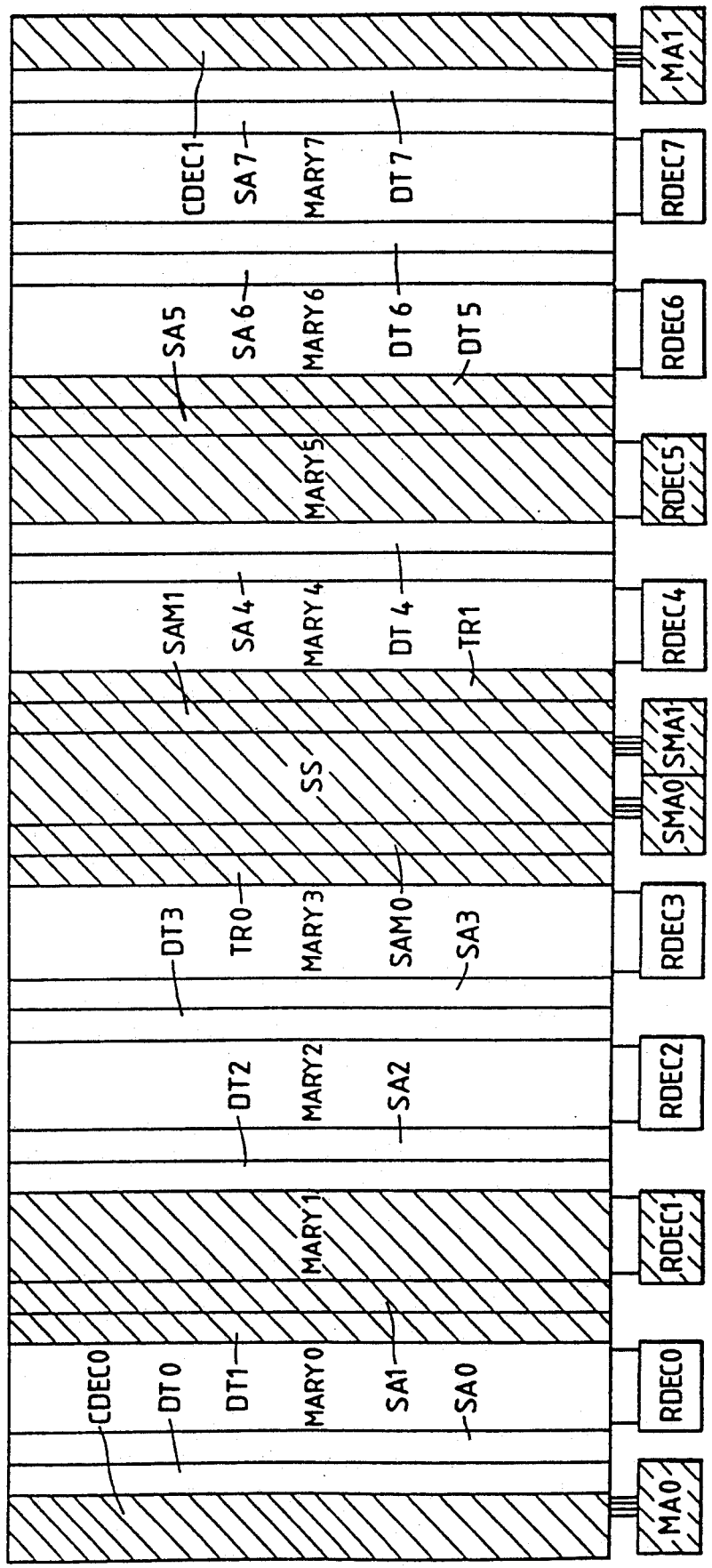
FIG. 16 is a block diagram showing another embodiment of the multi-port memory according to this invention.

Shown in FIG. 16 is a block diagram of another embodiment of the multi-port memory according to this invention.

In this embodiment, four memory arrays MARY0–3 and memory arrays MARY4–7 are respectively disposed on left and right sides with a serial selector SS located centrally. Besides, column decoders CDEC0 and CDEC1 are respectively arranged on the left and right sides of the two divisional sets of the memory arrays, and each of them takes charge of the column selections of the corresponding four memory arrays. When the common serial selector SS (SAm) is provided for the plurality of memory arrays MARY in this manner, parallel data transfer can be performed by utilizing the bit lines and sense amplifiers of the different nonselected memory arrays MARY as stated before.

In the case of employing the bit lines as the signal transmission paths as in the preceding embodiments, however, the comparatively large parasitic capacitance is added because the large number of memory cells are coupled to the bit lines. Thus, the signal transmission rate slows. Moreover, when the sense amplifiers are operated as described above, the current consumption of the memory increases.

In this embodiment, therefore, signal lines for the parallel transfer as explained below are laid.

Figure 17A:
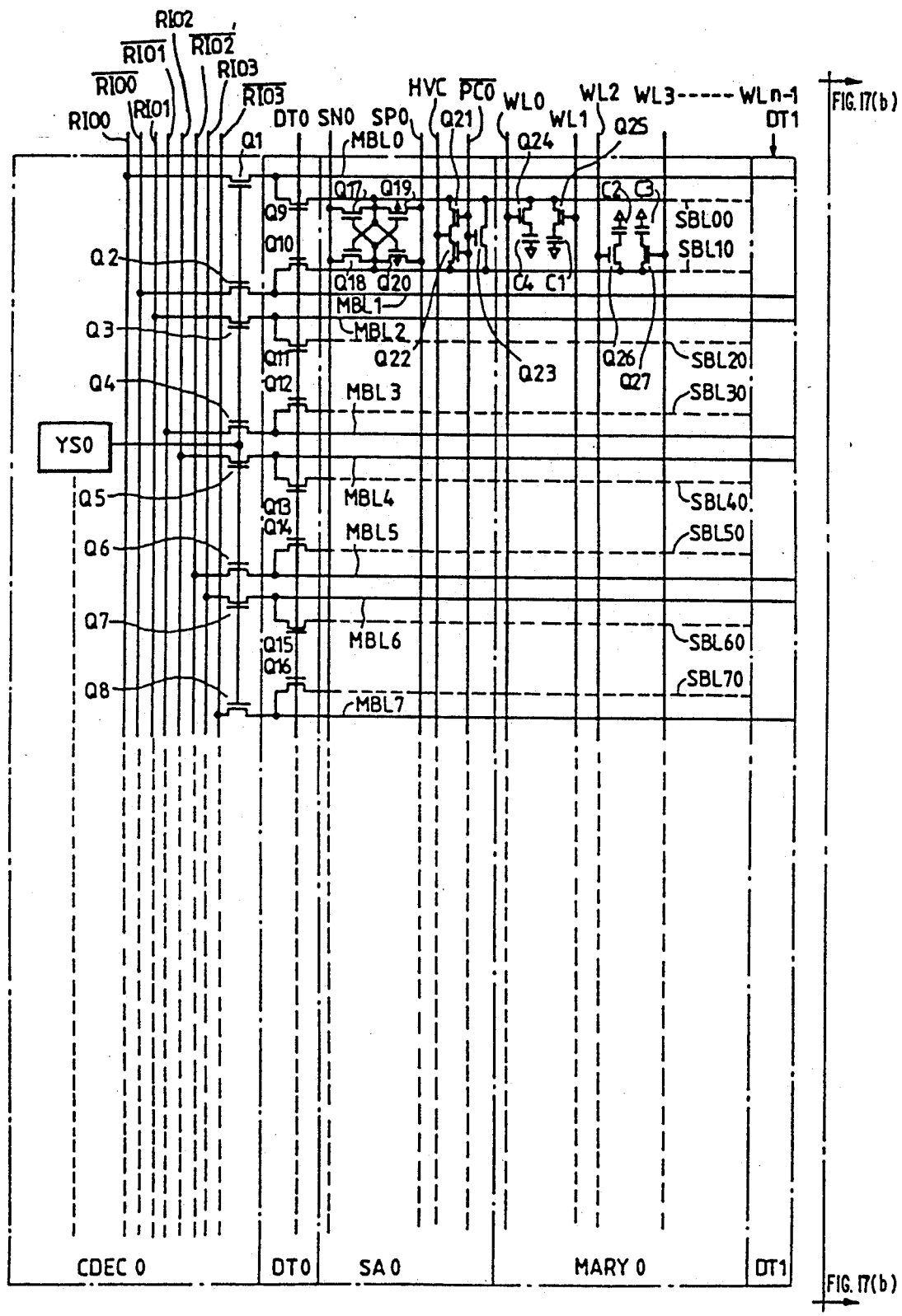
FIG. 17 is a circuit diagram showing still another embodiment of the multi-port memory according to this invention.
Figure 17B:
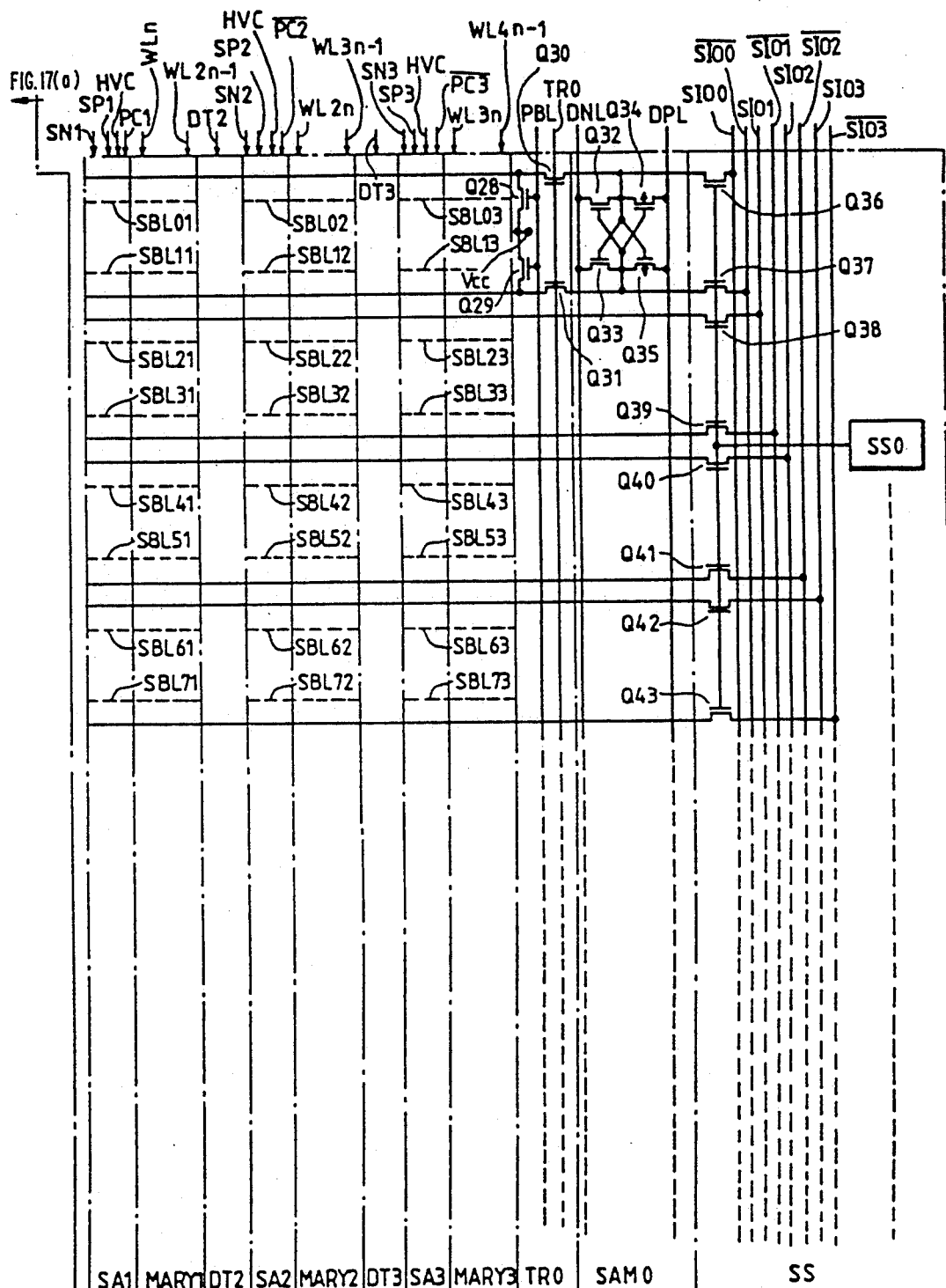

FIG. 17 shows a circuit diagram of still another embodiment of the multi-port memory according to this invention. In this embodiment, main bit lines MBL0 etc. are laid so as to pass through a plurality of memory arrays MARY0–3 or MARY4–7 for the parallel transfer of data as described above, and memory cells and sense amplifiers are coupled to sub bit lines SBL0 etc. Further, transfer switch MOSFETs Q9 etc. are interposed between the main bit line MBL0 and the sub bit lines SBL0 etc. and are controlled on/off by a signal DT0.

With this construction, the main bit lines do not have the large number of memory cells connected thereto and can have their parasitic capacitances lowered. Thus, propagation delay times in signal lines can be shortened, so that signals can be transmitted at high speed. Although no special restriction is intended, the main bit line can be formed so as to virtually overlap the sub bit lines, by utilizing multilayer metal wiring or the like. Therefore, the density of integration is not sacrificed.

Figure 18A:
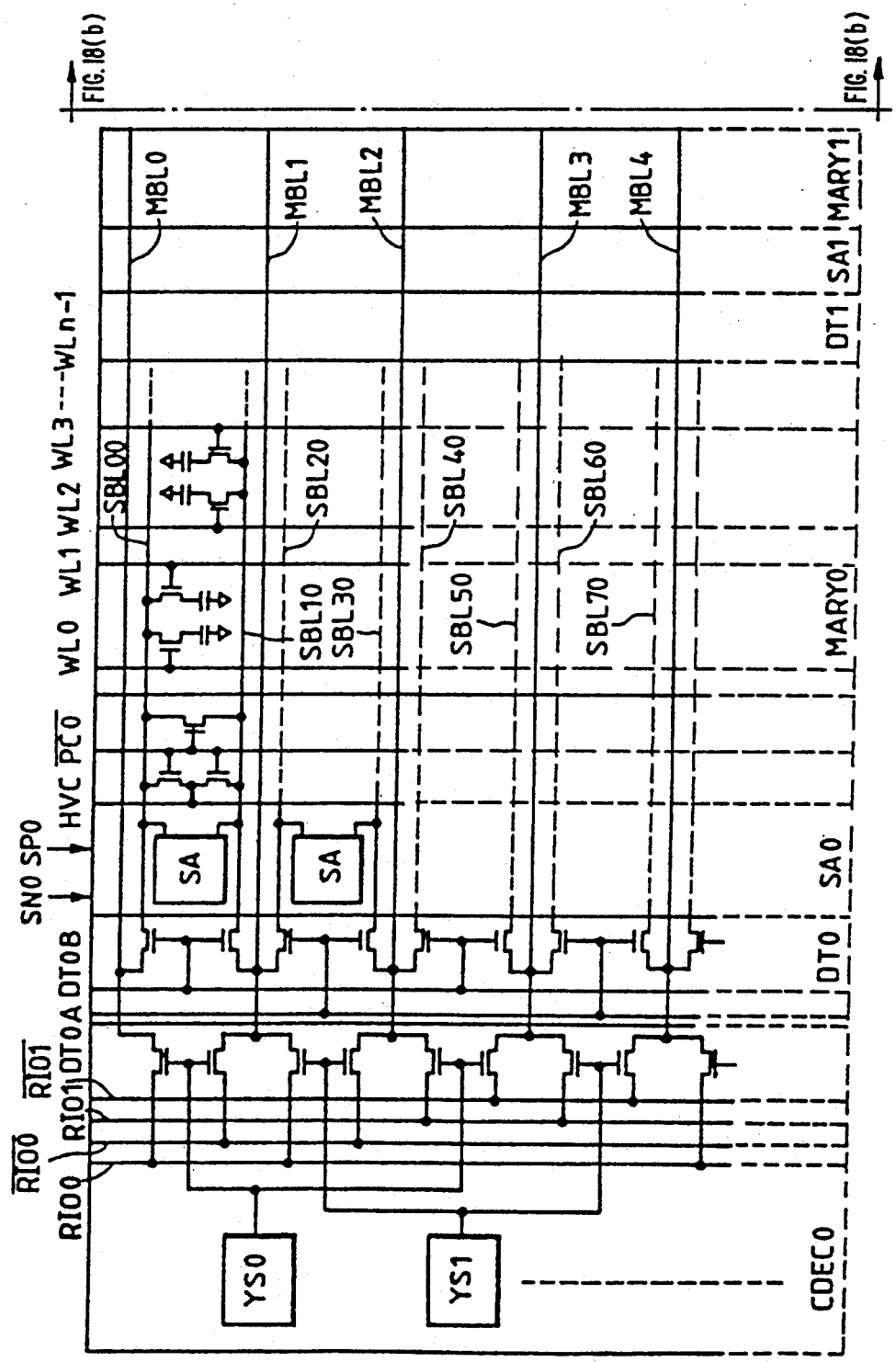
FIG. 18 is a circuit diagram showing still another embodiment of the multi-port memory according to this invention.
Figure 18B:
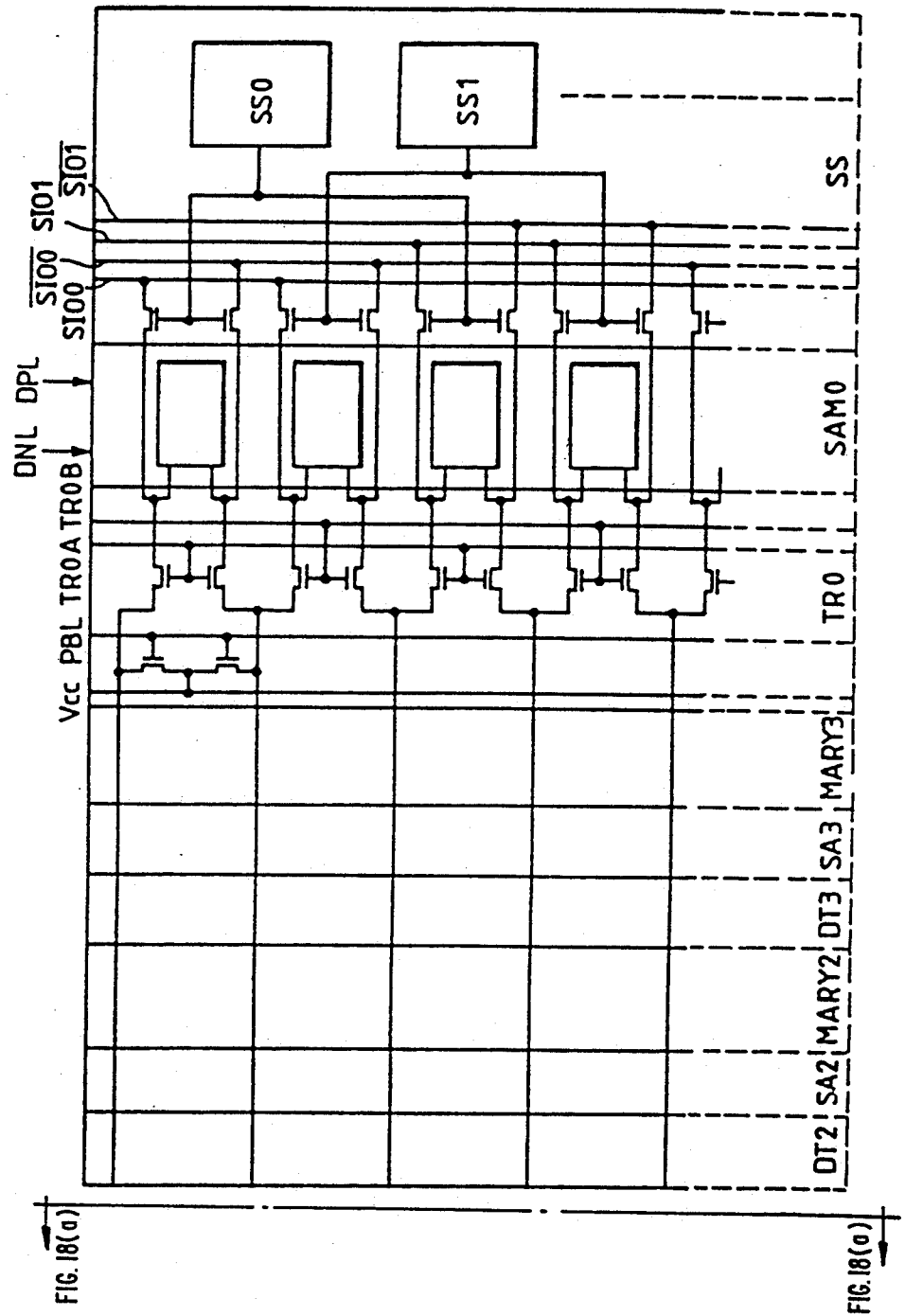

FIG. 18 shows a circuit diagram of still another embodiment of the multi-port memory according to this invention. In this embodiment, the adjacent ones of main bit lines as described above are formed in common. Further, data items to be transferred in parallel are separated into odd-numbered bits and even-numbered bits, which are transferred in time-division fashion in synchronism with transfer signals DTOA and DTOB. With this construction, the number of the main bit lines can be reduced to about ½.

Shown in FIG. 19 is a schematic block diagram for explaining an embodiment of a normal mode as well as a refresh mode in the semiconductor memory device according to this invention.

In this embodiment, both of two divided memory arrays MARY are activated for read/write operations in the normal mode (NORMAL). Accordingly, sense amplifiers SA are similarly activated. On the other hand, in the refresh mode (REFRESH), an address counter forms one surplus bit as a refreshing address which is internally generated. Thus, only one of the two memory arrays MARY is activated, and a word line is selected for a refresh operation. only one of the sense amplifiers SA is correspondingly activated, so that the power consumption of the memory device during the refresh mode can be lowered.

Figure 20A:
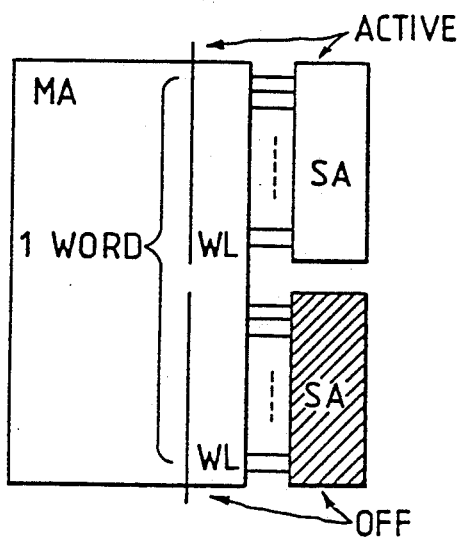
FIG. 20 is a schematic block diagram for explaining another embodiment of the normal mode as well as the refresh mode in the semiconductor memory device according to this invention.
Figure 20B:
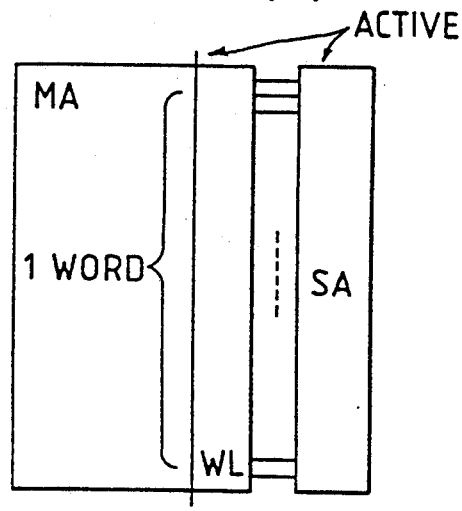
Figure 20C:
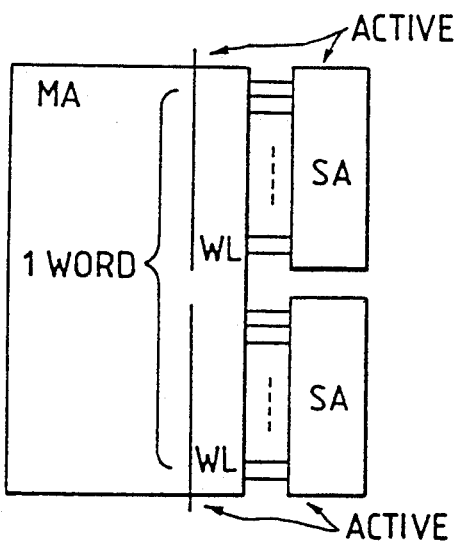

Shown in FIG. 20 is a schematic block diagram for explaining another embodiment of the normal mode as well as the refresh mode in the semiconductor memory device according to this invention.

Referring to the figure, a memory array MA has its word lines divided centrally. A sense amplifier is also divided into upper and lower sense amplifiers in accordance with the division of the word lines. Concretely, a common source line for activating the sense amplifier is divided in correspondence with the upper and lower sense amplifiers, and the divided lines are laid. In the refresh mode, as illustrated in a left upper diagram, the word lines of one group are brought into selected states, and the sense amplifier SA corresponding thereto is activated. On the other hand, in the normal mode, as illustrated in a left lower diagram, those of the word lines of the divisional groups to which an identical address is assigned are both selected. In correspondence with this situation, both the sense amplifiers SA are activated. In the case where the word lines are divided as described above, drive circuits divided into upper and lower portions are disposed in correspondence with the respective divided word lines. The number of memory cells to be coupled to each individual word line decreases to half owing to the division of the word lines. This signifies that the load of each word line lightens. Accordingly, the drive circuit of each word line can reduce its circuit scale owing to the light load. Thus, when the pitch of the word lines is narrowed in consequence of the microminiaturization of constituent elements or wiring lines intended to enlarge a storage capacity by way of example, advantageously the drive circuits can be laid out with their pitch equalized to the pitch of the word lines, by dividing also the drive circuits in correspondence with the division of the word lines as stated above.

At the right upper part of FIG. 20, a memory array MA and a sense amplifier SA in the prior art are shown for the sake of comparison. With the prior-art construction wherein the memory array MA and the sense amplifier SA are disposed in one-to-one correspondence, it is impossible to lower the current consumption of the refresh mode as stated above. The reason is that, in the memory cell of the dynamic type, a storage capacitor is read out destructively due to the charge sharing thereof with bit lines by the operation of selecting a word line. In the read operation, therefore, the dynamic type memory cell requires the rewrite operation that the signal magnitudes of the bit lines are amplified by the sense amplifier so as to return the memory cell into the original state of stored charges. Accordingly, when the word line is selected, the sense amplifier needs must be responsively activated in one-to-one correspondence.

As an expedient for dividing and operating the sense amplifier, apart from the construction wherein the respective divisional sense amplifiers are provided with the common source lines as described before, there may well be adopted a construction in which a power source voltage line and a ground potential line are arranged on each side of the sense amplifier, the individual unit circuits of the sense amplifier are respectively furnished with power switch MOSFETS, and switch control signals to be fed to the gates of the MOSFETs are dividedly set.

Figure 21:
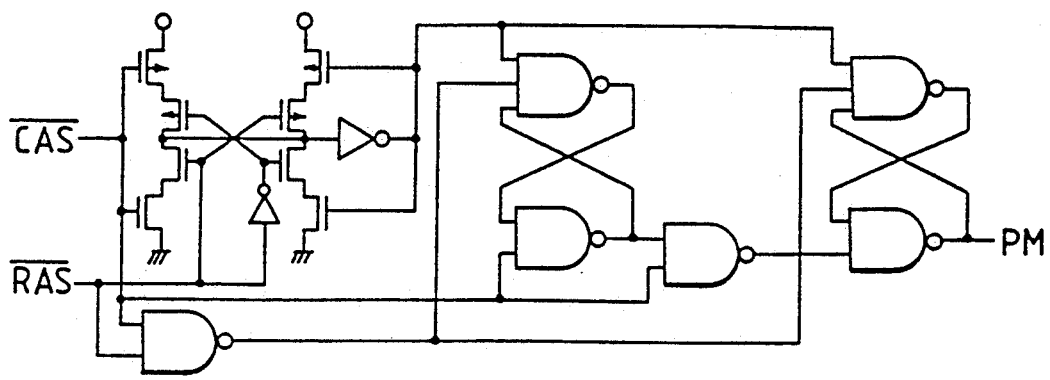
FIG. 21 is a circuit diagram showing an embodiment of a page mode recognize signal generator circuit.

FIG. 21 shows a circuit diagram of an embodiment of a generator circuit for a page mode recognize signal In a page mode, column addresses must be input whereas row addresses have heretofore been input. Therefore, it must be recognized that the operation of the memory device is the page mode. The illustrated circuit is a circuit for generating the signal which is activated in only the page mode. The page mode signal PM changes from a low level to a high level in response to the high level of the column address strobe signal $\overline{CAS}$ changed from the low level when the row address strobe signal $\overline{RAS}$ is at the low level. Besides, when both the signals $\overline{RAS}$ and $\overline{CAS}$ are set at the high level, the page mode signal PM is cleared to the low level. In the page mode, the signal PM is used for switching the address pins, I/O pins and address latches.

The address data and mask data are respectively applied as inputs from the address pins and the I/O pins. However, the items of the data are applied in time-division fashion, and the pins are used for various purposes. It is therefore important to decide the sorts of the pins from which the data items are applied and the times at which the data items are to be latched. To this end, the signal PM is employed. In case of applying pixel data as inputs, it is convenient to add the function of masking a specified bit for the alteration or correction of a color. The alteration etc. of colors are simplified by affording such a function by which the specified bit of the pixel data in 8-bit unit is masked (is left unchanged).

Figure 22:
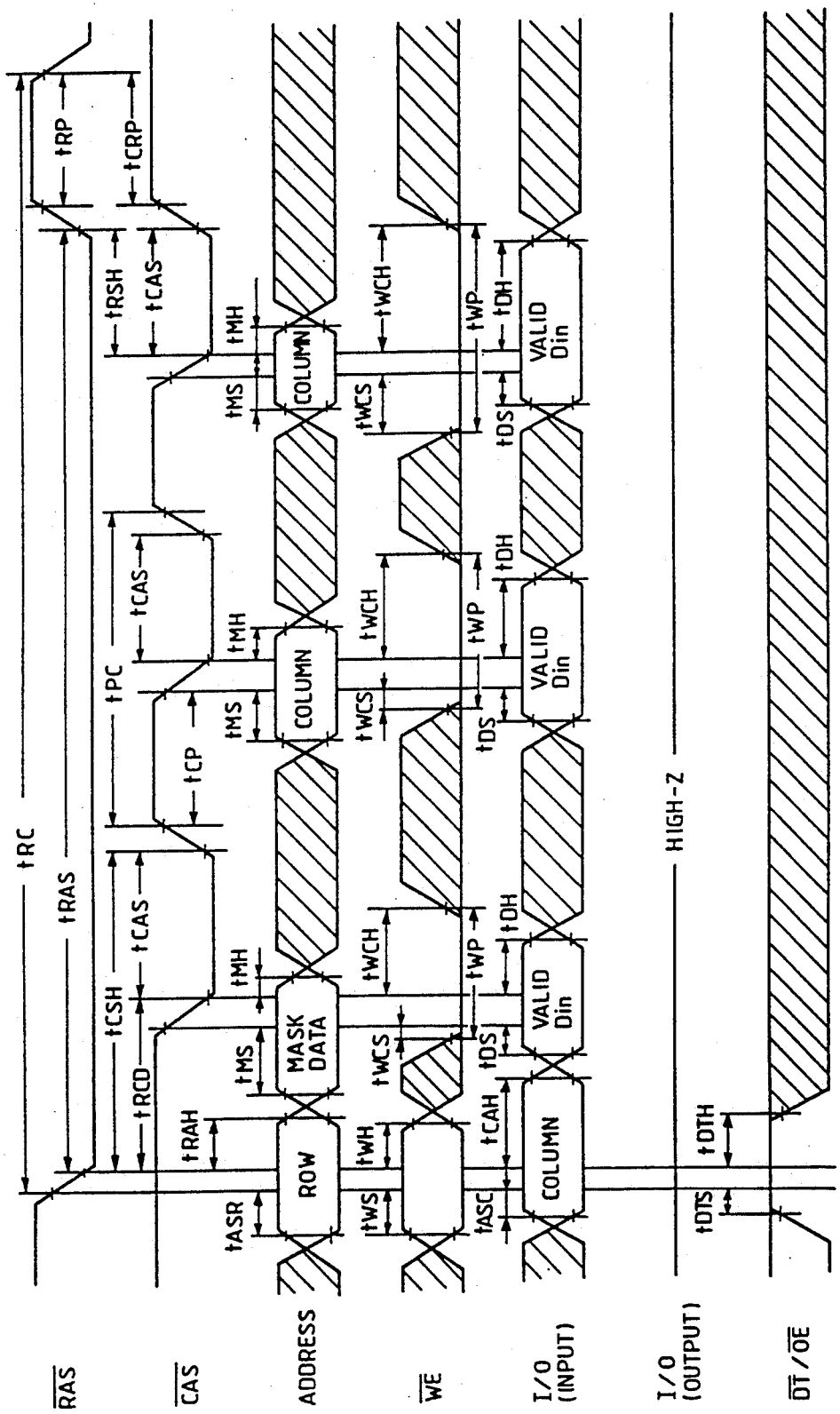
FIG. 22 is a timing chart showing an example of the operation of the signal generator circuit, in FIG. 21.

FIG. 22 is a timing chart showing an example of the above operation.

In the illustrated example, the row address signals and column address are respectively received from the address terminals and I/O pins in synchronism with the fall of the signal $\overline{RAS}$, and the mask data is received from the address terminals in response to the fall of the signal $\overline{CAS}$. In order to identify such operations, the signal $\overline{DT/OE}$- is set at the high level.

Figure 23:
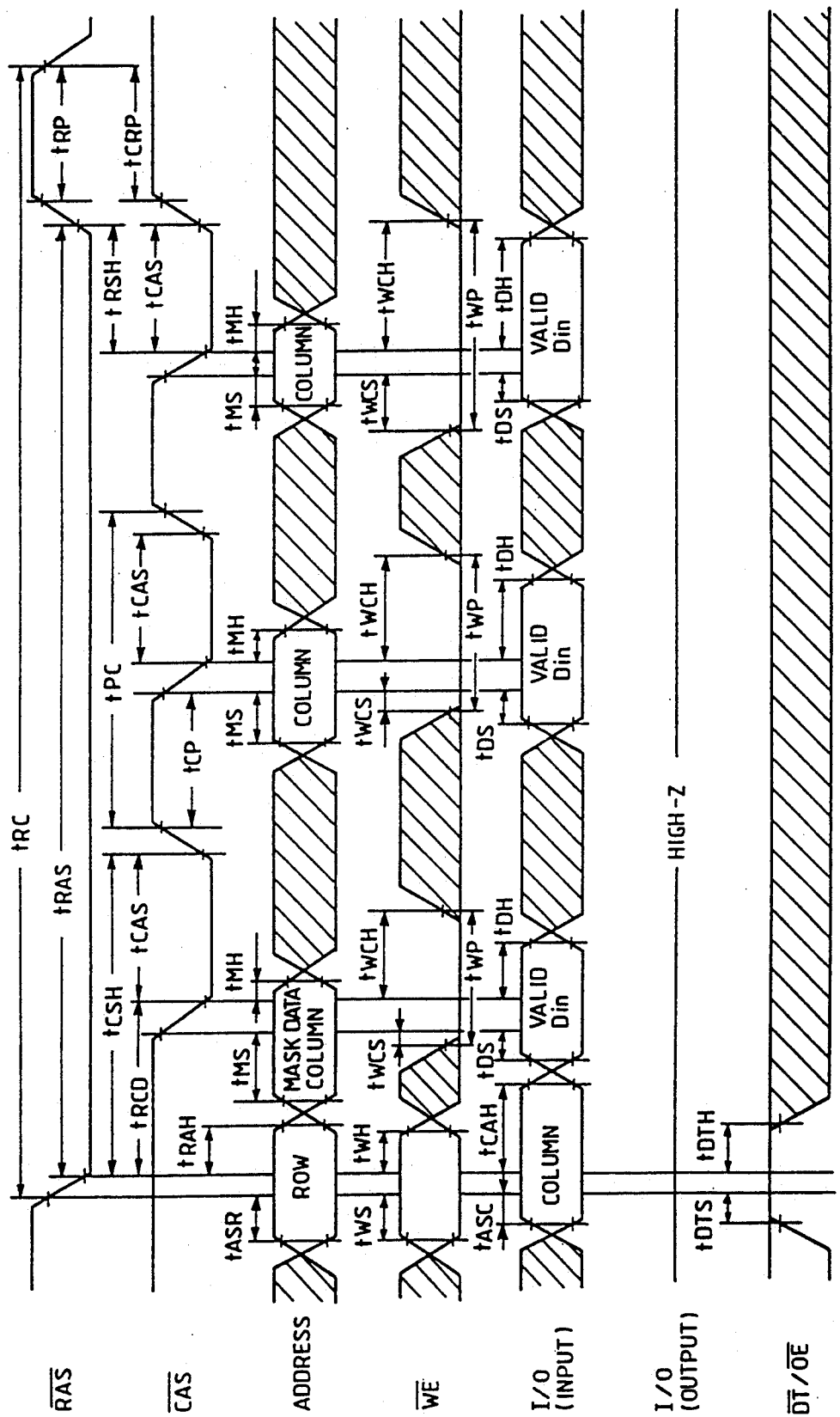
FIG. 23 is a timing chart showing another example of the operation of the signal generator in FIG. 21.

FIG. 23 is a timing chart showing another example of the above operation.

In the illustrated example, in the first cycle, the row address signals and the column address are respectively received from the address terminals and I/O pins in synchronism with the fall of the signal $\overline{RAS}$, and the mask data and the remaining column addresses are received from the address terminals in response to the fall of the signal $\overline{CAS}$. In and after the second cycle, the address are applied from the address terminals only.

Figure 24:
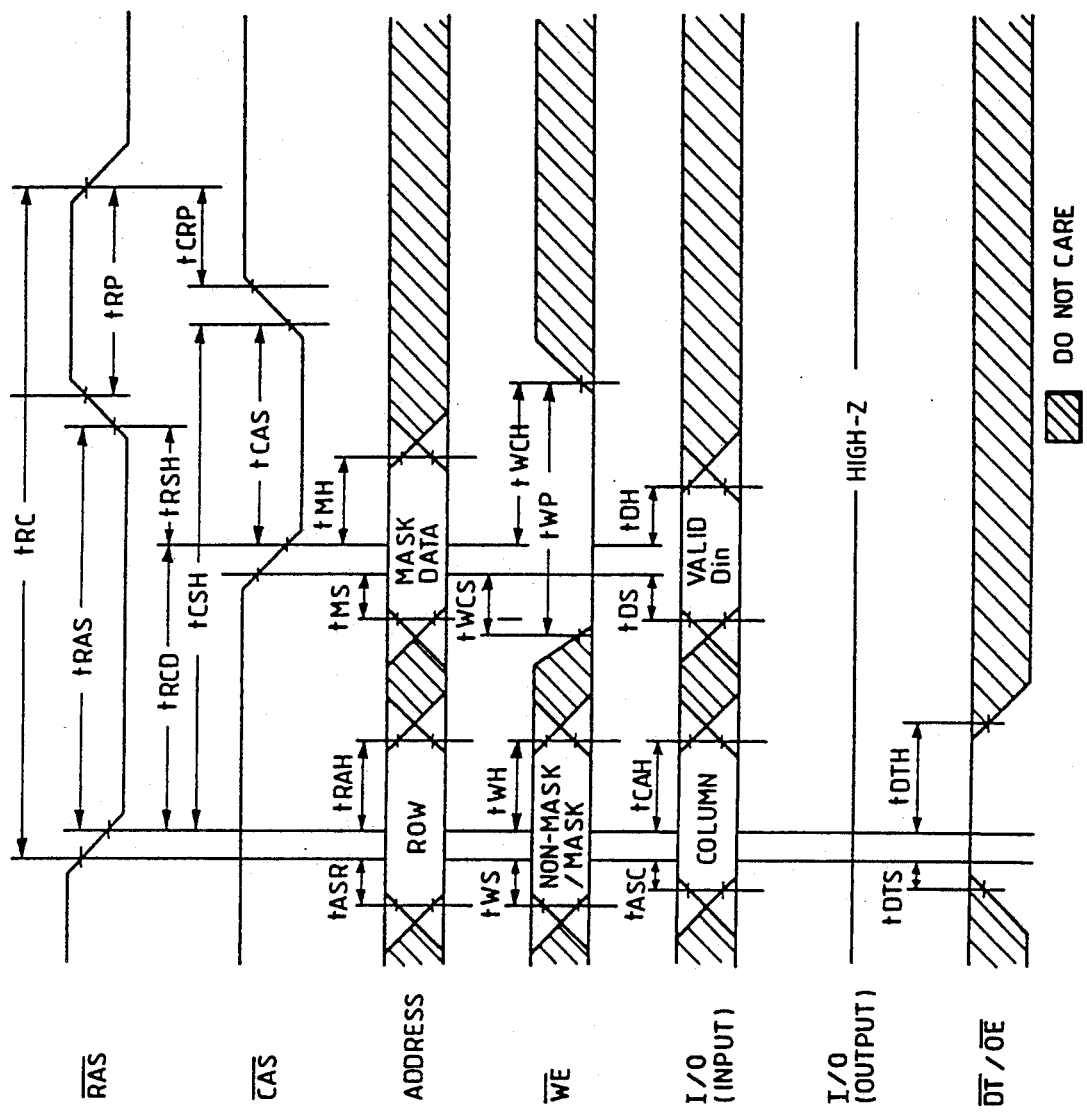
FIG. 24 is a timing chart showing still another example of the operation of the embodiment in FIG. 21.

FIG. 24 is a timing chart showing still another example of the above operation.

In the illustrated example, when the signal $\overline{RAS}$ falls, the row address and column address are respectively applied from the address pins and I/O pins as described before. If, on this occasion, the signal $\overline{WE}$ is at the high level, all the data items of the I/O pins are written into the memory cells (non-mask). In contrast, if the signal $\overline{WE}$ at the low level, no write operation is executed (mask) except for the case where the address pins are at the high level in synchronism with the fall of the signal $\overline{CAS}$.

Figure 25:
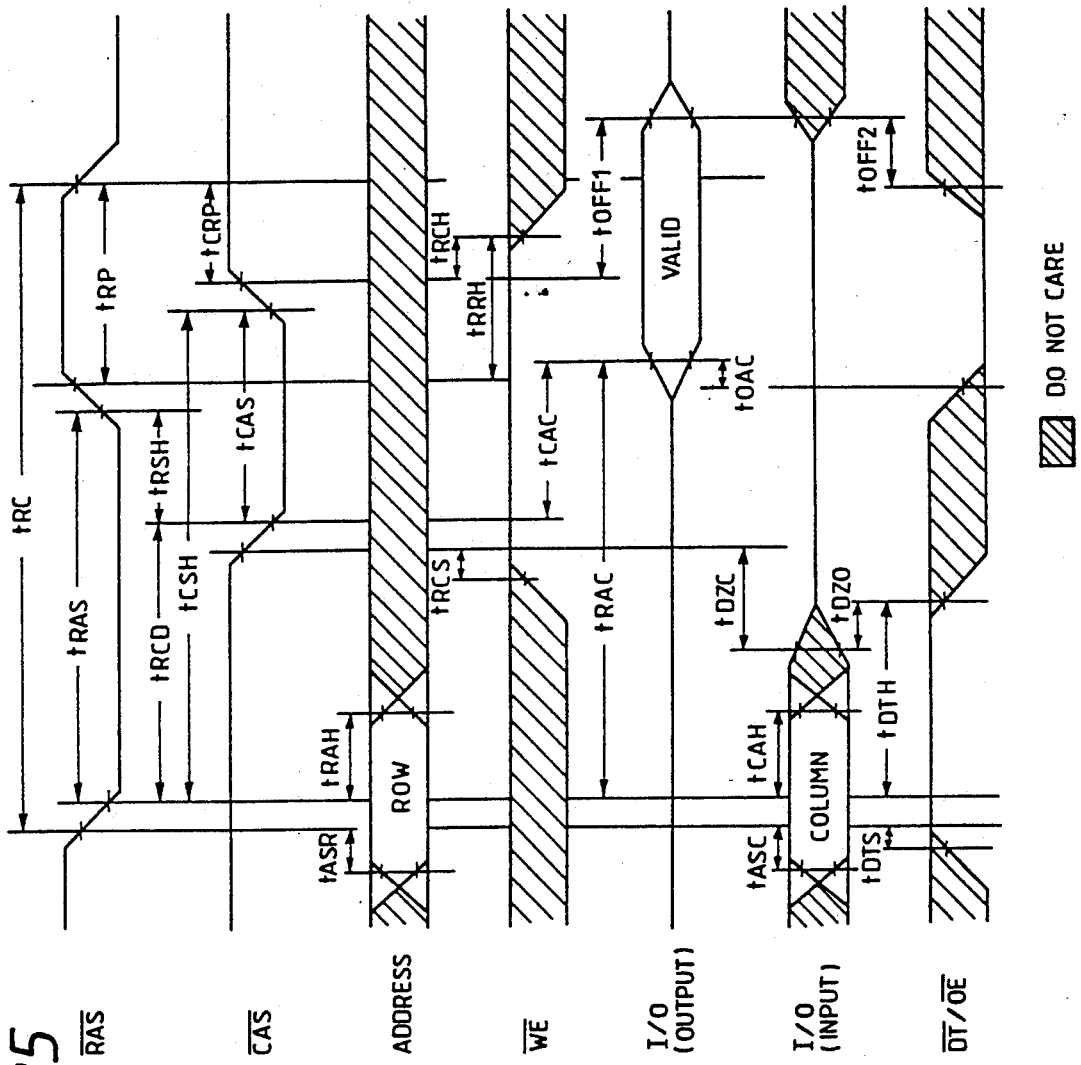
FIG. 25 is a timing chart showing still another example of the operation in FIG. 21.

FIG. 25 is a timing chart showing still another example of the above operation.

In the illustrated example, in a read cycle, the row address and the column address are respectively applied from the address pins and the I/O pins when the signal $\overline{RAS}$ falls. The relations of the addresses with the pins may well be reversed.

Figure 26:
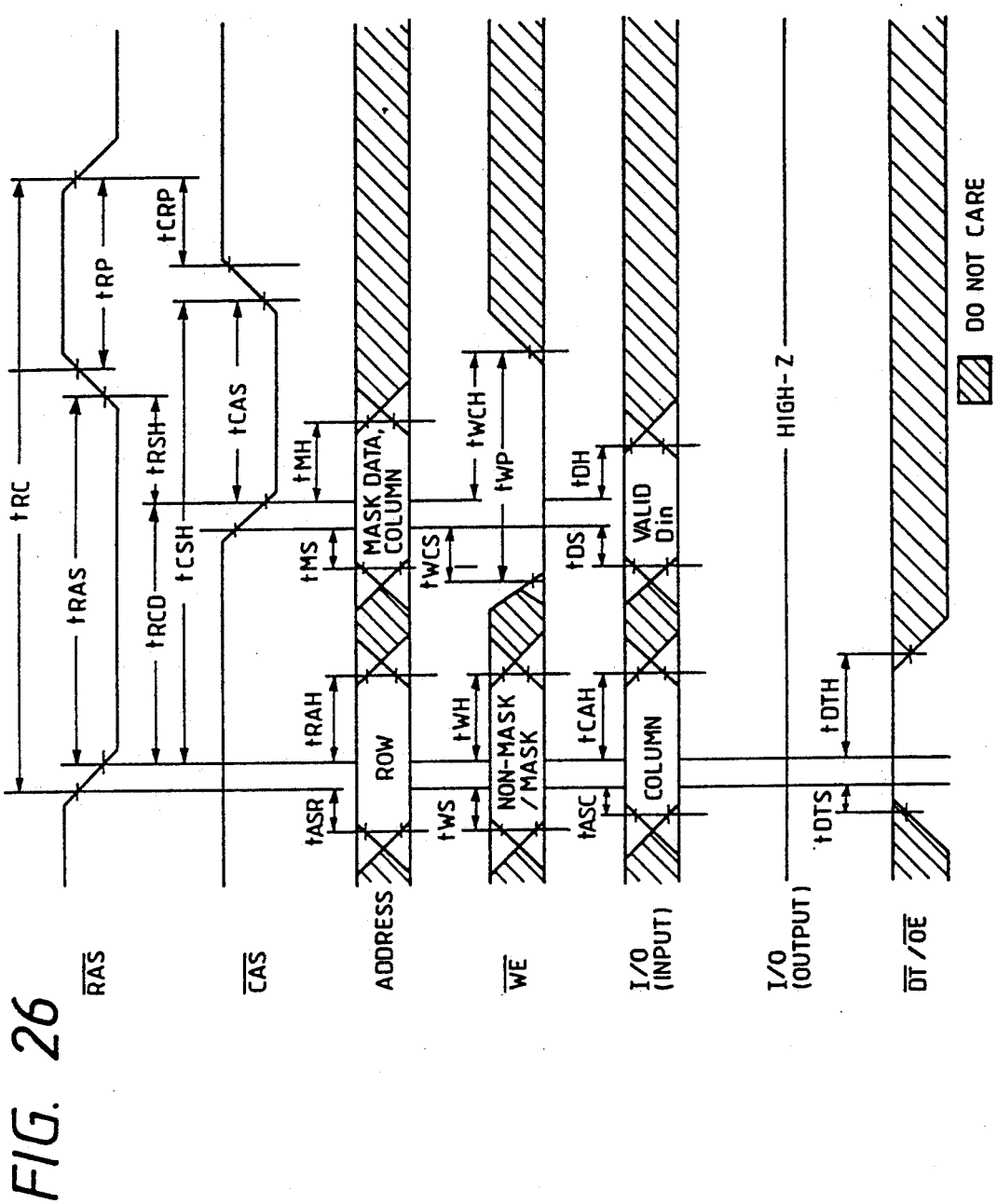
FIG. 26 is a timing chart showing still another example of the operation in FIG. 21.

FIG. 26 is a timing chart showing still another example of the above operation.

In the illustrated example, that part of the column address which exceeds the number of the I/O pins is applied from the address pins at the fall of the signal $\overline{CAS}$. When the signal $\overline{CAS}$ falls, the mask data and the column address coexist on the address pins. The others are the same as in the case of FIG. 24.

Figure 27:
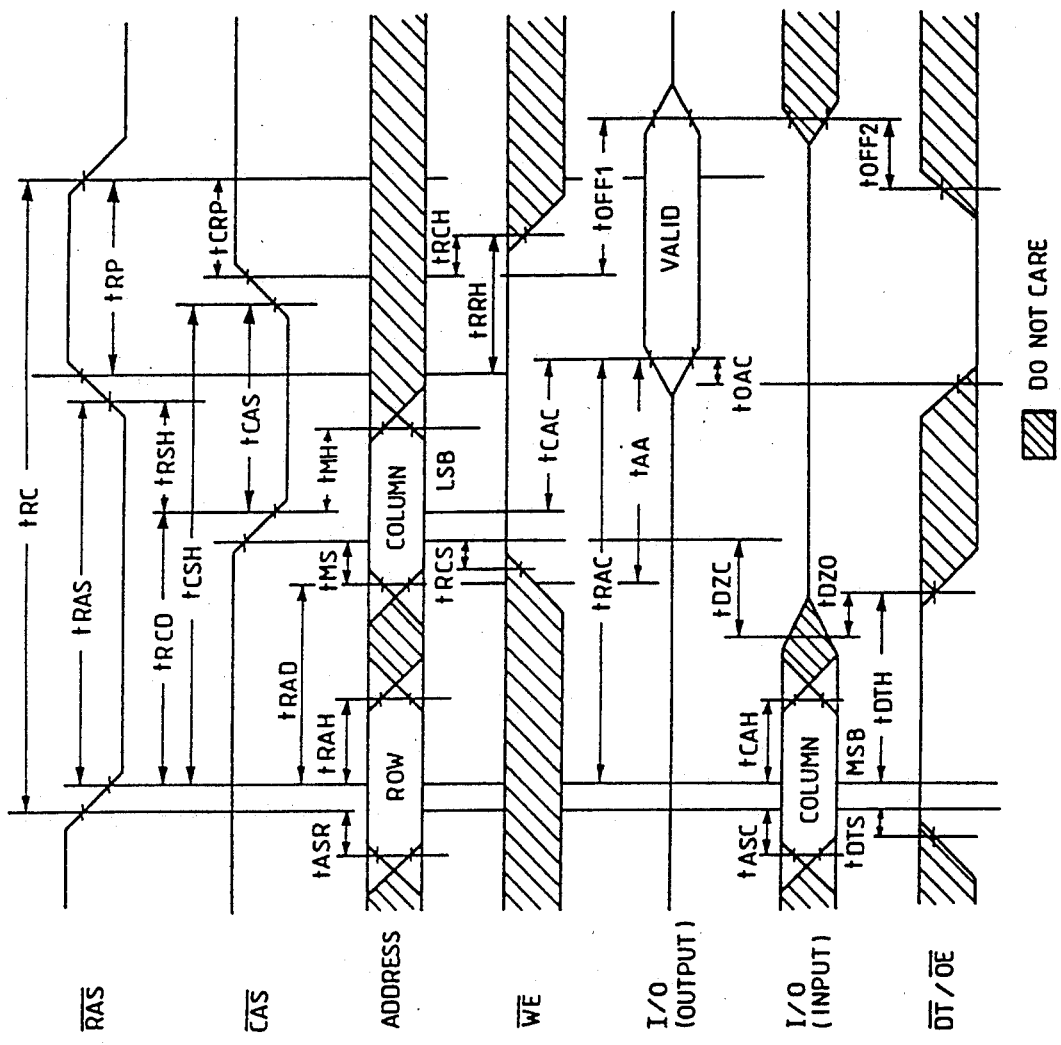
FIG. 27 is a timing chart showing still another example of the operation in FIG. 21.

FIG. 27 is a timing chart showing still another example of the above operation.

The illustrated example is the same as the example of FIG. 25 except that the part of the col=n address exceeding the number of the I/O pins is applied from the address pins at the fall of the signal $\overline{CAS}$.

In the operating waveform diagrams referred to above, hatched parts signify "Do not care".

Figure 28:
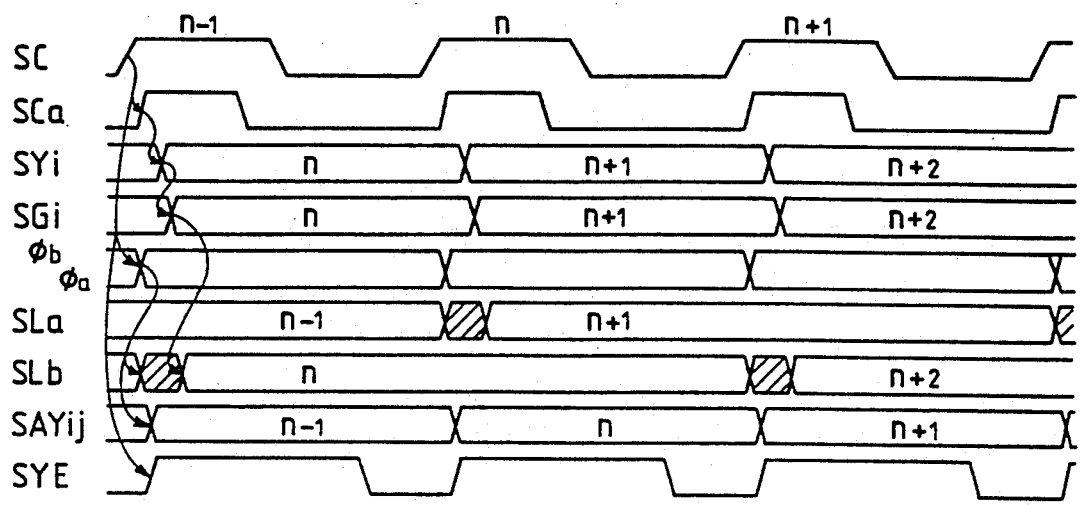
FIG. 28 is a timing chart for explaining an example of the operation of the Gray code counter (GCC)

FIG. 28 shows a timing chart for explaining an example of the operation of the Gray code counter GCC.

In order to execute the pipeline processing as described before, the latch for holding the output of the predecoder is provided, and it is made a double construction and is controlled by timing pulses $\phi a$ and $\phi b$. Thus, the time lag of the operation can be limited to correspond to only one stage of the gates as illustrated in the figure.

Figure 29:
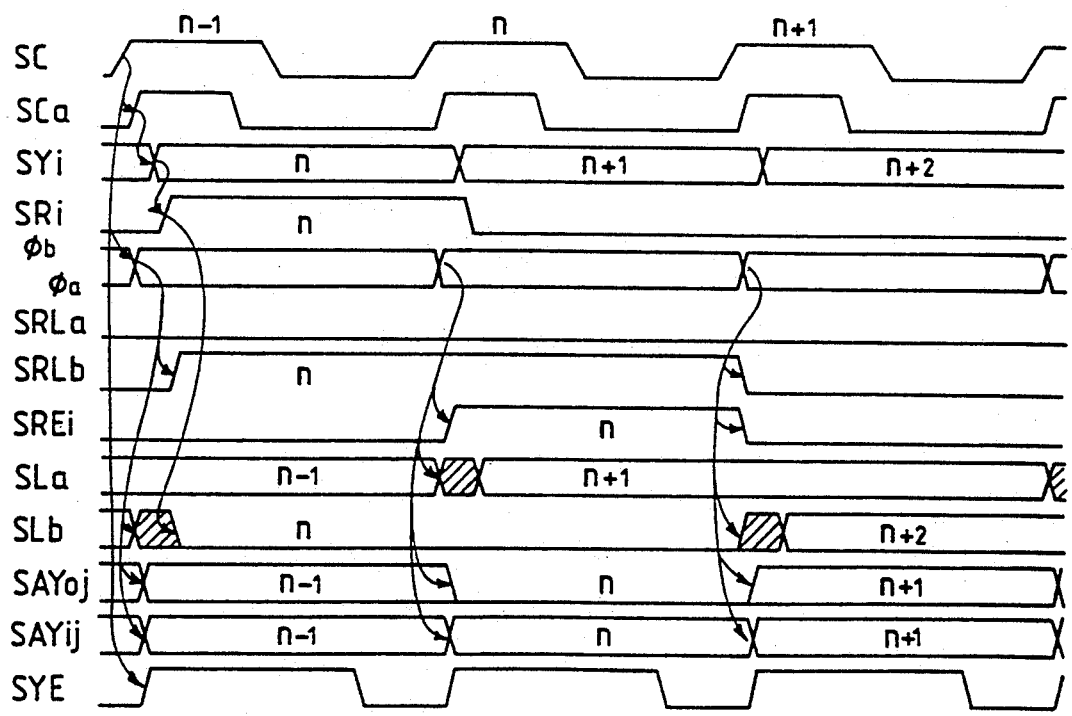
FIG. 29 is a timing chart for explaining another example of the operation of the Gray code counter (GCC)

FIG. 29 shows a timing chart for explaining another example of the operation of the Gray code counter GCC.

Shown in the figure is an example in which the n-th address is defective and is changed-over to the redundant bit lines. By utilizing the Gray code counter GCC as illustrated in the figure, the change-over to the redundancy circuit is permitted while the regular periodicity of the serial output operation is kept.

Figure 30:
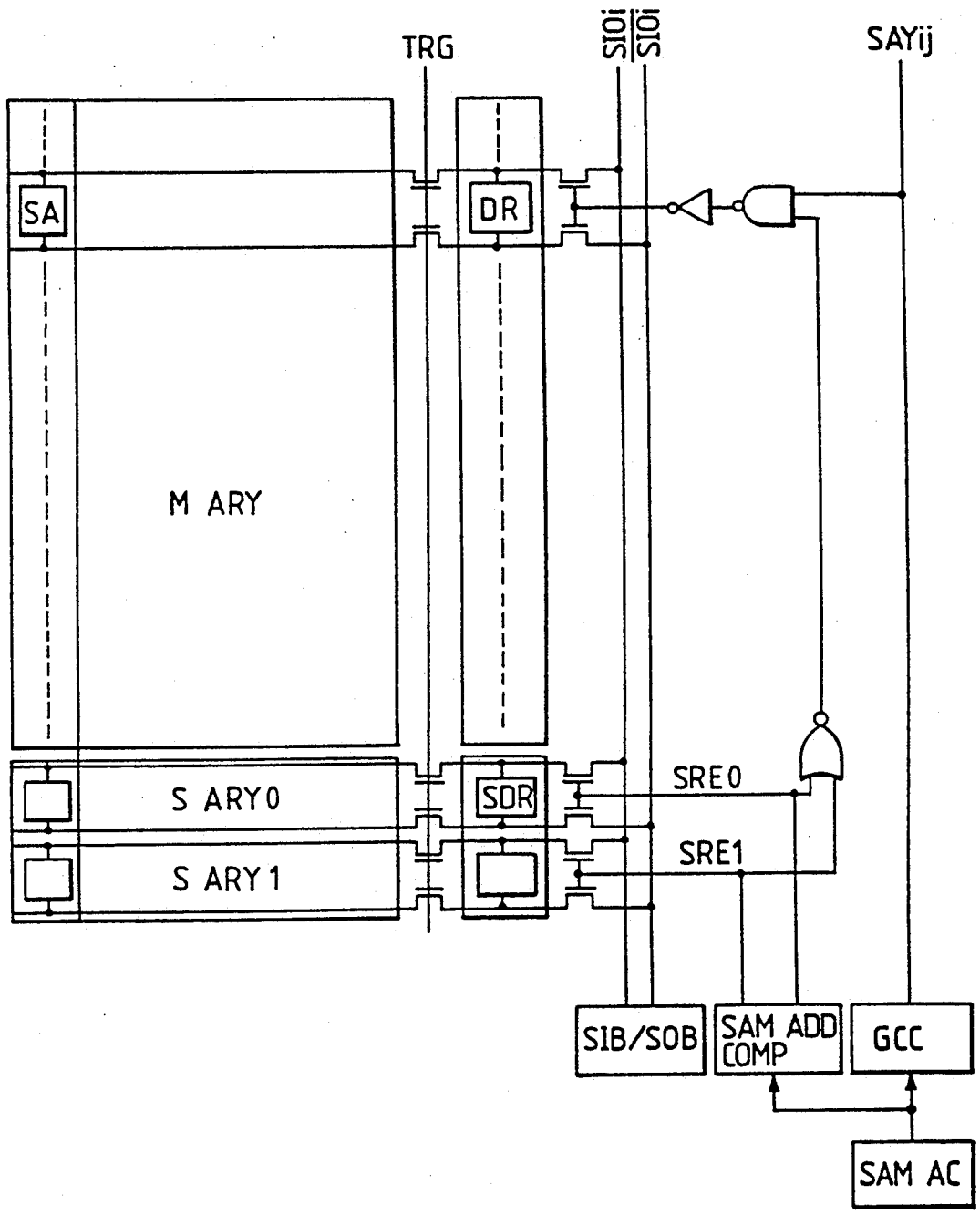
FIG. 30 is a block diagram of essential portions showing an embodiment of a serial port section in the semiconductor memory device according to this invention.

FIG. 30 shows a block diagram of the essential portions of an embodiment of a serial port section in the semiconductor memory device according to this invention.

In this embodiment, in order to remedy bit line defects, spare arrays SARY0 and 1 are provided for a memory array MARY. Transfer gates, data registers SDR (SAM) and serial selectors which are spare, are provided in correspondence with the spare arrays SARY0 and 1.

An address formed by a serial address counter SAMAC is compared with a defective address by an address comparator circuit COMP. When an access to the defective address is detected, a signal SRE0 or SRE1 is generated. Then, a decode output formed of the output of the Gray code counter GCC described before, in other words, a select signal for a serial selector is invalidated. Simultaneously, the spare serial selector is switched and controlled so as to select spare bit lines instead of the defective bit lines.

Such a serial port section is applicable, not only to the multi-port memory, but also to a semiconductor memory device having only a serial port.

Figure 31:
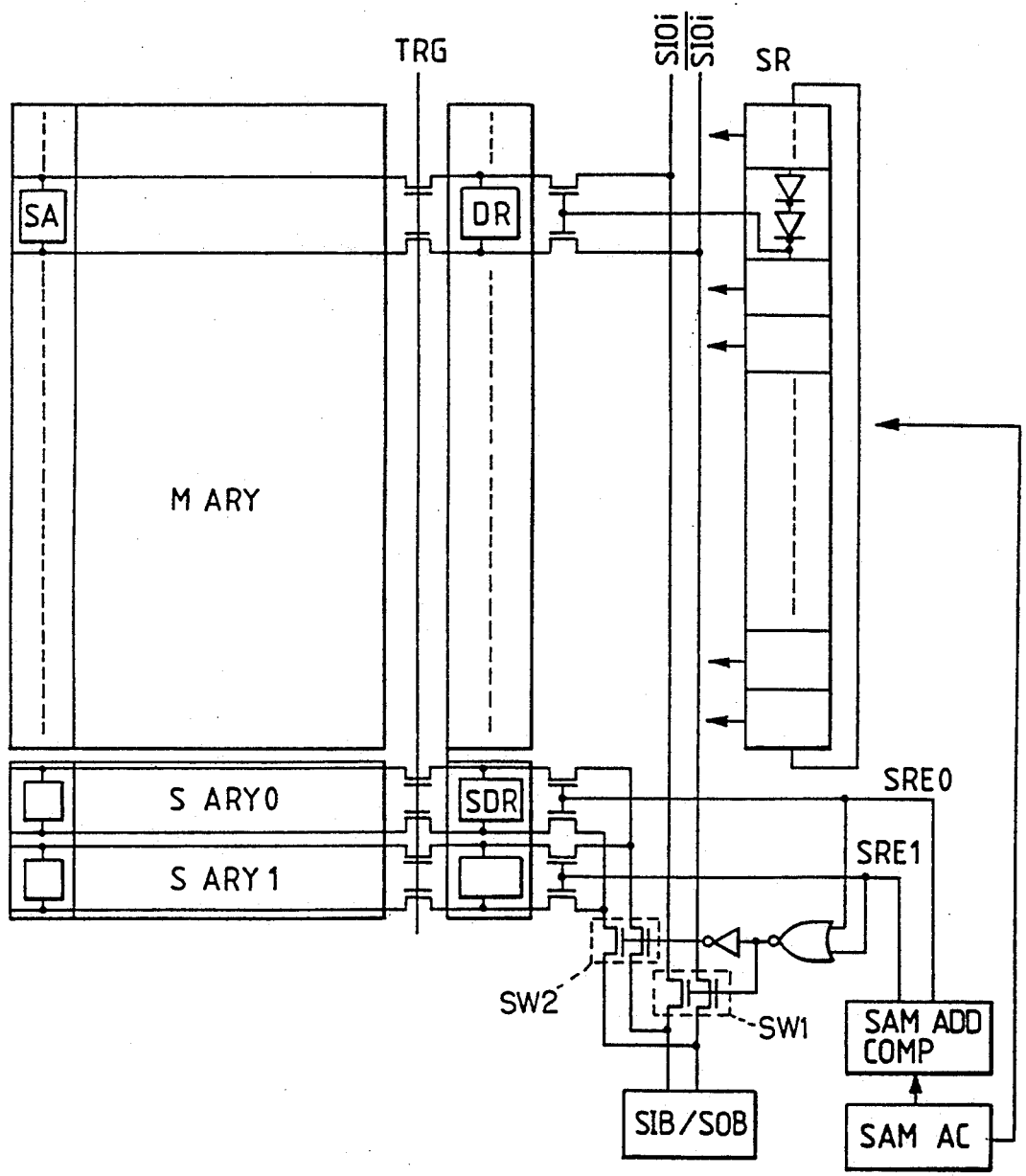
FIG. 31 is a block diagram of essential portions showing another embodiment of the serial port section in the semiconductor memory device according to this invention.

FIG. 31 shows a block diagram of the essential portions of another embodiment of the serial port section in the semiconductor memory device according to this invention.

In this embodiment, spare arrays SARY0 and 1 are provided for a memory array MARY in order to remedy bit line defects as in the preceding embodiment. Also, transfer gates, data registers SDR and serial selectors which are spare are provided in correspondence with the spare arrays SARY0 and 1.

In this embodiment, select signals for serial selectors are formed by a shift register SR which replaces the Gray code counter GCC. More specifically, logic "1" for the select signals is input to the shift register SR and is shifted by clock pulses, thereby to select the serial selectors in succession.

In this construction, switch circuits are interposed between serial input/output lines SIOI and SIOI and a serial input/output buffer SIB/SOB. An address formed by a serial address counter SAMAC is compared with a defective address by an address comparator circuit COMP. When an access to the defective address is detected, a signal SRE0 or SRE1 is generated to bring the switch circuit into its "off" state. Instead, the signal brings a switch circuit into its "on" stage, this switch circuit being interposed between the corresponding spare array and the serial input/output buffer SIB/SOB, so as to connect spare bit lines. Thus, while the defective bit is selected in the shift register SR thereby to maintain the con-L-inuity of this shift register, the access to the defective bit is changed-over to the spare bit as viewed from the input/output buffer SIB/SOB.

Such a serial port section is applicable, not only to the multi-port memory, but also to the semiconductor memory device having only the serial port.

Figure 32:
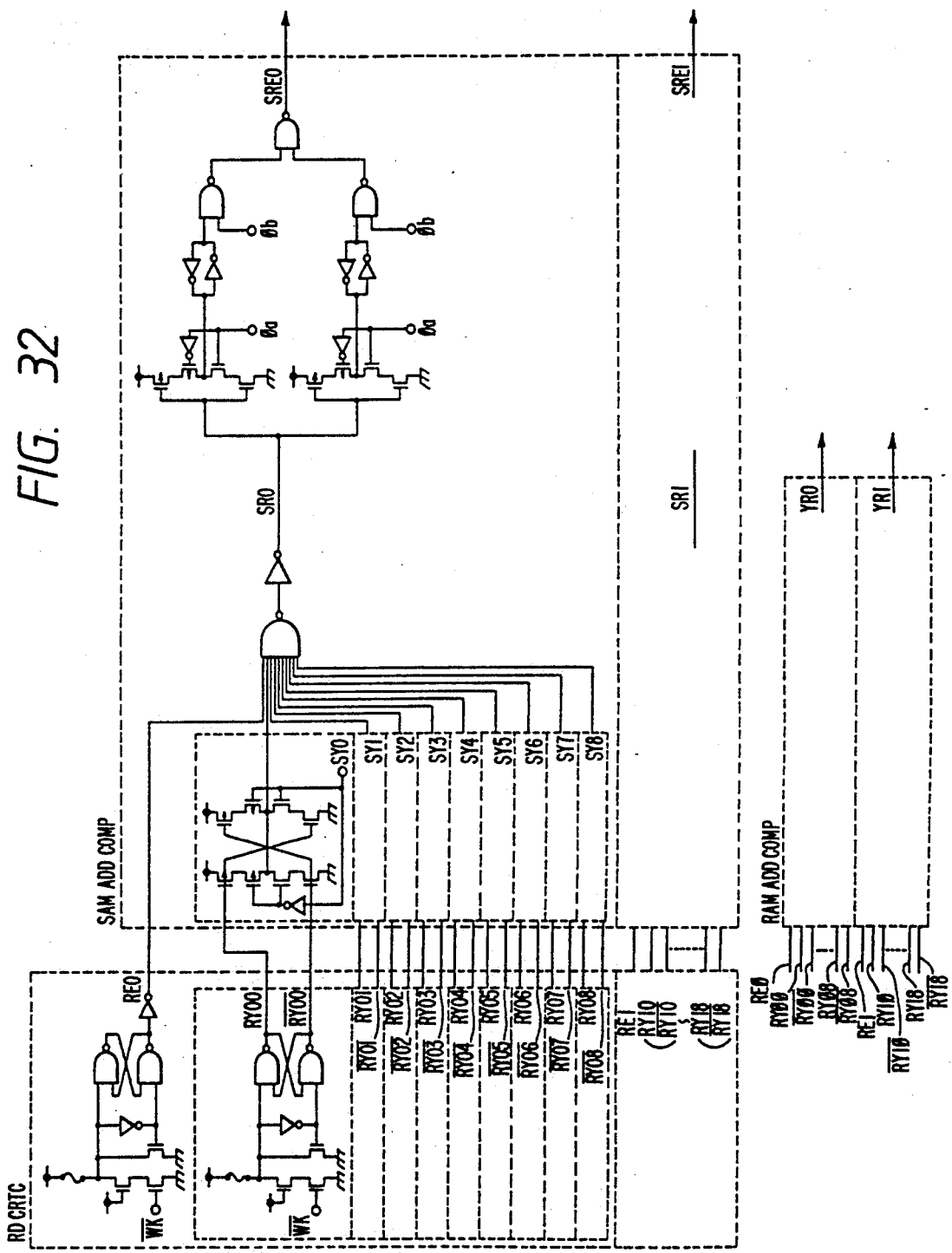
FIG. 32 is a circuit diagram showing an embodiment of a defective address storage circuit as well as an address comparator circuit.

FIG. 32 shows a circuit diagram of an embodiment of the defective address storage circuit as well as the address comparator circuit described above.

Although not especially restricted, fuse means made of polycrystalline silicon or the like are is employed for storing defective addresses. That is, the fuse members are selectively burnt out with a laser beam or the like, thereby to store the defective addresses. The stored defective addresses RY00-RY08 and counter outputs SY0-SYB formed by the serial address counter SAMAC are compared by a digital comparator circuit for which a CMOS multiplexer is utilized. When both the signals coincide, the output of the comparison is set at a high level (logic"1"). If all the bits (0-8) of the address signal coincide, a coincidence detection signal SR0 obtained through a NAND gate circuit and an inverter circuit becomes the high level.

Thus, the output of the predecoder in FIG. 30 is invalidate, or the switch circuit between the serial input/output lines SIOI and $\overline{\text{SIOI}}$ and the serial input/output buffer SIB/SOB in FIG. 31 is turned "off", whereby the spare bit lines are selected by the signal SRE0 or 1.

The storage circuit and comparator circuit for the defective addresses as stated above are similarly applied to the redundancy circuit of the row group.

Functional effects which are attained by the foregoing embodiments are as follows:

(1) Each of, at least, serial input/output lines is divided into two parts at the middle point thereof, and input/output circuits are provided at both the ends of each part, whereby the loads of the serial input/output lines of a multi-port memory lighten, to bring forth the effect that an enlarged storage capacity and a heightened operating speed can be realized.

(2) In a serial read mode, a column selector circuit for random access is simultaneously operated, and read data passed through the random-access column selector circuit is used as head data for a serial output operation and is delivered through a serial output circuit, thereby to bring forth the effect that the speed of the serial output operation is permitted to heighten.

(3) A serial input/output operation is performed by switching and controlling a serial selector with a select signal which is formed by a Gray code counter, thereby to bring forth the effect that a higher operating speed, reduced coupling noise, and a lower power consumption can be achieved.

(4) The combination between a serial input/output function and a random input/output function utilizing the Gray code counter brings forth the effect that a multi-port memory which realizes a higher operating speed can be constructed.

(5) When a serial input/output select signal corresponding to a defective bit is detected, a data latch corresponding to redundant bit lines is selected instead of the defective bit, whereby also defective bit lines can be remedied, to bring forth the effect that the available percentage of the manufactured articles of a semiconductor memory device having a serial port can be enhanced.

(6) A random input/output function and a serial input/output function are both afforded, each memory mat is divided into two, upper and lower parts in the direction of serial input/output lines, and amplifier circuits and data buses corresponding to the divided serial input/output lines are arranged on right and left sides with respect to the memory mat, thereby to bring forth the effect that a higher operating speed and a larger storage capacity can be realized.

(7) bit lines in a nonselected memory mat which lies between a selected memory mat and a serial input/output circuit are used as signal transmission paths, and a sense amplifier for the nonselected memory mat is operated as an amplifier circuit. With this construction, the serial input/output circuit can be shared by a large number of memory mats, and special signal wiring therefor is dispensed with, to bring forth the effect that enlarging a storage capacity and heightening a density of integration are permitted.

(8) A serial input/output circuit is provided in correspondence with a plurality of memory mats, and bit lines for parallel data transfer, which are common to the plurality of memory mats, are laid, thereby to bring forth the effect that heightening a density of integration and heightening an operating speed are permitted.

(9) The adjacent ones of the bit lines for the parallel data transfer are made common and are used in time-division fashion, thereby to bring forth the effect that a higher density of integration and a higher operating speed can be realized.

(10) Address signals for refresh are internally generated, and the number of memory mats to be simultaneously activated in a refresh mode is rendered smaller than in a normal mode, thereby to bring forth the effect that a current consumption in the refresh mode can be lowered.

Although, in the above, the invention made by the inventor has been concretely described on the basis of embodiments, it is needless to say that this invention is not restricted to the foregoing embodiments, but that it can be variously altered within a scope not departing from the purport thereof. By way of example, all the embodiments are not applied only to multi-port memories, but each of the embodiments may well be applied to a semiconductor memory device having only a serial access port, or a semiconductor memory device having only a random access port, in conformity with the features thereof.

This invention can be extensively utilized for semiconductor memory devices and the redundancy systems and layout systems thereof.

What is claimed is:

1. A semiconductor memory device comprising:
    a first random memory array including a first bit line coupled to a plurality of memory cells;
    a second random memory array including a second bit line coupled to a plurality of memory cells;

a serial memory array for converting parallel information from said first and second random memory arrays to serial information, including at least one register circuit for storing information from one of said memory cells included in said first and second random memory arrays;

selecting means for selecting one of said memory cells of said first random memory array;

first switching means for coupling said first bit line with said second bit line in response to selection of said one of said memory cells of said first memory array; and first transfer switching means for coupling said second bit line with said register circuit so that information stored in said selected memory cell of said first random memory array can be coupled to said register circuit via said second bit line.

2. A semiconductor memory device according to claim 1, wherein said first switching means includes:

a first sense amplifier for amplifying a first signal on said first bit line, which first signal represents stored information from said selected one of said memory cells of said first random memory array, wherein said first sense amplifier is coupled between said first bit line and a first switching circuit which is coupled to said second bit line and which connects said first sense amplifier and said second bit line.

3. A semiconductor memory device according to claim 2, wherein said first switching means further includes a second switching circuit coupled between said first bit line and said first sense amplifier.

4. A semiconductor memory device according to claim 3, wherein said first switching circuit includes a first MOSFET.

5. A semiconductor memory device according to claim 4, wherein said second switching circuit includes a second MOSFET.

6. A semiconductor memory device according to claim 3, further comprising:

a third random memory array including a third bit line coupled to a plurality of memory cells;

a fourth random memory array including a fourth bit line coupled to a plurality of memory cells;

second switching means for coupling said third bit line with said fourth bit line in response to selection of memory cells included in third and fourth random memory arrays, and second transfer switching means for coupling said fourth bit line with said register circuit;

wherein said third bit line is coupled to said first transfer switching means.

7. A semiconductor memory device according to claim 6, wherein said second switching means comprises:

a second sense amplifier for amplifying a second signal on at least one of said first, second and third bit lines, which second signal represents stored information from one of said memory cells, wherein said second sense amplifier is coupled between said third bit line and a third switching circuit which is coupled to said fourth bit line and which connects said second sense amplifier and said fourth bit line.

8. A semiconductor memory device according to claim 7, wherein said second switching means includes a fourth switching circuit coupled between said third bit line and said second sense amplifier.

9. A semiconductor memory device according to claim 8, wherein said third switching circuit includes a third MOSFET.

10. A semiconductor memory device according to claim 9, wherein said fourth switching circuit includes a fourth MOSFET.

11. A semiconductor memory device according to claim 8, wherein said second sense amplifier enters an active state after said first sense amplifier means enters an active stage.

12. A semiconductor memory device according to claim 8, further comprising:

a third sense amplifier for amplifying a third signal on at least one of said first and second bit lines, which third signal represents stored information from one of said memory cells, wherein said third sense amplifier is coupled between said second bit line and a fifth switching circuit which is coupled to said third bit line and which connects said third sense amplifier and said third bit line.

13. A semiconductor memory device according to claim 12, wherein said first transfer switching means includes a sixth switching circuit coupled between said second bit line and said third sense amplifier.

14. A semiconductor memory device according to claim 13, wherein said third sense amplifier enters an active state after said first sense amplifier enters an active state.

15. A semiconductor memory device according to claim 14, wherein said third sense amplifier enters an active state before said second sense amplifier enters an active state.

16. A semiconductor memory device according to claim 15, wherein said fifth switching circuit includes a fifth MOSFET.

17. A semiconductor memory device according to claim 16, wherein said sixth switching circuit includes a sixth MOSFET.

18. A semiconductor memory device comprising:

a first random memory array including a first bit line coupled to a plurality of memory cells;

a second random memory array including a second bit line coupled to a plurality of memory cells;

an output device for receiving information from one of memory cells included in said first and second random memory arrays;

a selector for selecting one of said memory cells of said first random memory array; and a switch for coupling said first bit line with said second bit line in response to selection of one of said memory cells of said first random memory array so that information stored in said selected memory cell in said first random memory array will be coupled to said output device via said second bit line of said second random memory array.

* * * * *